US010833696B1

(12) United States Patent
Koyama

(10) Patent No.: US 10,833,696 B1
(45) Date of Patent: Nov. 10, 2020

(54) SUCCESSIVE-APPROXIMATION TYPE AD CONVERTER AND PIPELINE TYPE AD CONVERTER

(71) Applicant: ASAHI KASEI MICRODEVICES CORPORATION, Tokyo (JP)

(72) Inventor: Kazuo Koyama, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 16/861,477

(22) Filed: Apr. 29, 2020

(30) Foreign Application Priority Data

May 7, 2019 (JP) .................................. 2019-087622
Mar. 2, 2020 (JP) .................................. 2020-034850

(51) Int. Cl.
  *H03M 1/46* (2006.01)
  *H03M 1/16* (2006.01)
  *H03M 1/12* (2006.01)

(52) U.S. Cl.
  CPC ........... *H03M 1/466* (2013.01); *H03M 1/167* (2013.01); *H03M 1/12* (2013.01)

(58) Field of Classification Search
  CPC ......... H03M 1/466; H03M 1/167; H03M 1/12
  USPC ..................................................... 341/155
  See application file for complete search history.

(56) References Cited

U.S. PATENT DOCUMENTS

| 6,380,881 | B2 | 4/2002 | Harada et al. |
| 8,643,529 | B2 | 2/2014 | Lin |
| 10,715,163 | B2* | 7/2020 | Chao ................... H03M 1/1033 |
| 10,727,857 | B2* | 7/2020 | Farid .................... H03M 1/462 |
| 10,735,018 | B2* | 8/2020 | Hu ....................... H03M 1/1033 |

FOREIGN PATENT DOCUMENTS

| JP | 2003-163597 A | 6/2003 |
| JP | 2011-114577 A | 6/2011 |

* cited by examiner

*Primary Examiner* — Brian K Young
(74) *Attorney, Agent, or Firm* — Morgan, Lewis & Bockius LLP

(57) ABSTRACT

There is provided a successive-approximation type AD converter and a pipeline type AD converter without delay due to sample hold. A successive-approximation type AD converter 1 includes: receiving circuits configured to output the analog input signal according to the received analog input signal; subtractors configured to calculate subtraction signals between the analog input signal in each of n successive conversions and comparison signals obtained by DA-converting the control values by DA converters; comparators configured to determine a high-low relationship between the voltages of the subtraction signals and the reference voltage; a control circuit configured to update the control values so that the comparison signals approach the analog input signal based on the comparison results; and an output register configured to output the digital output signal based on the comparison results of the comparators.

16 Claims, 15 Drawing Sheets

FIG.3

| NEG | D1 | D2 | D3 | D4 | D5 | DA0 | VALUE OF SECOND TERM OF EQUATION (4) |
|---|---|---|---|---|---|---|---|
| 0 | 1 | 1 | 1 | 1 | 1 | 31 | $\frac{31}{32} \cdot \frac{C}{C_{total}} \cdot (VRP-VRN)$ |
| ⋮ | | | | | | | |
| 0 | 1 | 0 | 1 | 0 | 0 | 20 | $\frac{20}{32} \cdot \frac{C}{C_{total}} \cdot (VRP-VRN)$ |
| ⋮ | | | | | | | |
| 0 | 0 | 1 | 1 | 0 | 0 | 12 | $\frac{12}{32} \cdot \frac{C}{C_{total}} \cdot (VRP-VRN)$ |
| ⋮ | | | | | | | |
| 0 | 0 | 1 | 0 | 0 | 0 | 8 | $\frac{8}{32} \cdot \frac{C}{C_{total}} \cdot (VRP-VRN)$ |
| ⋮ | | | | | | | |
| 0 | 0 | 0 | 1 | 0 | 0 | 4 | $\frac{4}{32} \cdot \frac{C}{C_{total}} \cdot (VRP-VRN)$ |
| 0 | 0 | 0 | 0 | 1 | 1 | 3 | $\frac{3}{32} \cdot \frac{C}{C_{total}} \cdot (VRP-VRN)$ |
| 0 | 0 | 0 | 0 | 1 | 0 | 2 | $\frac{2}{32} \cdot \frac{C}{C_{total}} \cdot (VRP-VRN)$ |
| 0 | 0 | 0 | 0 | 0 | 1 | 1 | $\frac{1}{32} \cdot \frac{C}{C_{total}} \cdot (VRP-VRN)$ |
| 0 OR 1 | 0 | 0 | 0 | 0 | 0 | 0 | 0 |
| 1 | 0 | 0 | 0 | 0 | 1 | -1 | $-\frac{1}{32} \cdot \frac{C}{C_{total}} \cdot (VRP-VRN)$ |
| 1 | 0 | 0 | 0 | 1 | 0 | -2 | $-\frac{2}{32} \cdot \frac{C}{C_{total}} \cdot (VRP-VRN)$ |
| 1 | 0 | 0 | 0 | 1 | 1 | -3 | $-\frac{3}{32} \cdot \frac{C}{C_{total}} \cdot (VRP-VRN)$ |
| 1 | 0 | 0 | 1 | 0 | 0 | -4 | $-\frac{4}{32} \cdot \frac{C}{C_{total}} \cdot (VRP-VRN)$ |
| ⋮ | | | | | | | |
| 1 | 0 | 1 | 0 | 0 | 0 | -8 | $-\frac{8}{32} \cdot \frac{C}{C_{total}} \cdot (VRP-VRN)$ |
| ⋮ | | | | | | | |
| 1 | 0 | 1 | 1 | 0 | 0 | -12 | $-\frac{12}{32} \cdot \frac{C}{C_{total}} \cdot (VRP-VRN)$ |
| ⋮ | | | | | | | |
| 1 | 1 | 0 | 1 | 0 | 0 | -20 | $-\frac{20}{32} \cdot \frac{C}{C_{total}} \cdot (VRP-VRN)$ |
| ⋮ | | | | | | | |
| 1 | 1 | 1 | 1 | 1 | 1 | -31 | $-\frac{31}{32} \cdot \frac{C}{C_{total}} \cdot (VRP-VRN)$ |

SUCCESSIVE-APPROXIMATION TYPE AD CONVERTER AND PIPELINE TYPE AD CONVERTER

BACKGROUND OF THE INVENTION

Field of the Invention

The present invention relates to a successive-approximation type AD converter and a pipeline type AD converter.

Description of the Related Art

Conventionally, an active noise cancellation (ANC) system for a headphone first AD-converts noise from the outside. Next, the system calculates a sound canceling out noise components reaching the ear out of the AD-converted noise by using DSP (Digital Signal Processor). Then, the system DA-converts the calculation result and outputs it from the headphone to cancel out noise reaching the ear. In this case, if it takes time for the AD conversion, a signal canceling out noise is too late for noise coming from the outside and thus the noise cannot be completely canceled out. Therefore, in such a system, an AD converter with small conversion delay is expected. For example, a pipeline type A/D converter described in PTLs 1 and 2 is known as an A/D converter with small delay. Moreover, a successive-approximation type A/D converter described in PTL 3 is known as an A/D converter.

CITATION LIST

Patent Literatures

PTL 1: JP 2003-163597 A
PTL 2: U.S. Pat. No. 8,643,529
PTL 3: JP 2011-114577 A

SUMMARY OF THE INVENTION

An object of the present invention is to provide a successive-approximation type A/D converter and a pipeline type A/D converter without delay due to sample hold.

To achieve the above object, a successive-approximation type AD converter according to one embodiment of the present invention includes: a receiving circuit configured to receive a first analog input signal and to continuously output a second analog input signal according to the first analog input signal; a subtraction signal calculation circuit configured to calculate a subtraction signal between an analog reference signal and the second analog input signal in each of n successive conversions (n is a natural number of 2 or more, the same applies hereinafter); a determining circuit configured to determine whether a voltage of the subtraction signal is higher than a reference voltage; a reference value arithmetic circuit configured to update a reference value so that the analog reference signal approaches the second analog input signal based on a determination result of the determining circuit; a DA converter configured to convert the reference value into the analog reference signal; and an output circuit configured to output a digital output signal based on the determination result of the determining circuit.

Moreover, to achieve the above object, a pipeline type AD converter according to one embodiment of the present invention has a plurality of stages and a final stage cascaded, each of the plurality of stages including: a first successive-approximation type secondary AD converter configured to convert an analog input signal into a digital output signal; a DA converter configured to convert the digital output signal output from the first successive-approximation type secondary AD converter into an analog output signal; and an amplifier circuit configured to amplify a signal of a difference between the analog input signal and the analog output signal. Additionally, the final stage includes a second successive-approximation type secondary AD converter configured to convert the signal of the difference output from a last-end stage of the plurality of stages into a digital output signal. Herein, the first and second successive-approximation type secondary AD converters are constituted by the successive-approximation type AD converter.

According to the present invention, successive determination processing can be performed on the subtraction signal between the analog reference signal and the second analog input signal according to the first analog input signal received by the receiving circuit at the timing of the determination by the determining unit. This makes it possible to perform AD conversion processing on an analog input signal that changes in real time, instead of the sampled and held fixed analog input signal. As a result, compared to a configuration for the AD conversion processing of the sampled and held fixed analog input signal, delay due to sample hold can be removed and a conversion rate can be improved.

BRIEF DESCRIPTION OF THE DRAWINGS

FIG. 1A is a diagram illustrating a basic configuration of a single-ended configuration and FIG. 1B is a diagram illustrating a basic configuration of a differential configuration;

FIG. 3 is a diagram illustrating a correspondence relationship between the value of the second term of Equation (4) and control values NEG, D1, D2, D3, and DA0 when "n=4";

FIG. 10A is a diagram explaining a configuration that can obtain 5-bit output and FIG. 10B is a diagram explaining a configuration that can obtain 6-bit output;

DESCRIPTION OF THE PREFERRED EMBODIMENTS

Hereinafter, exemplary embodiments of the present invention will be explained with reference to the accompanying drawings. In the description of the drawings referenced in the following description, the same or similar parts have the same or similar reference numbers.

Moreover, embodiments to be described below exemplify an apparatus and a method for embodying the technical idea of the present invention, and the technical idea of the present invention does not specify the structure, arrangement, and the like of the components as described below. The technical idea of the present invention can be variously modified within the technical scope defined by each claim described in the claims.

In explaining each embodiment of the present invention, the related art of each embodiment of the present invention will be first explained based on FIGS. 17 to 21.

Figure 17:
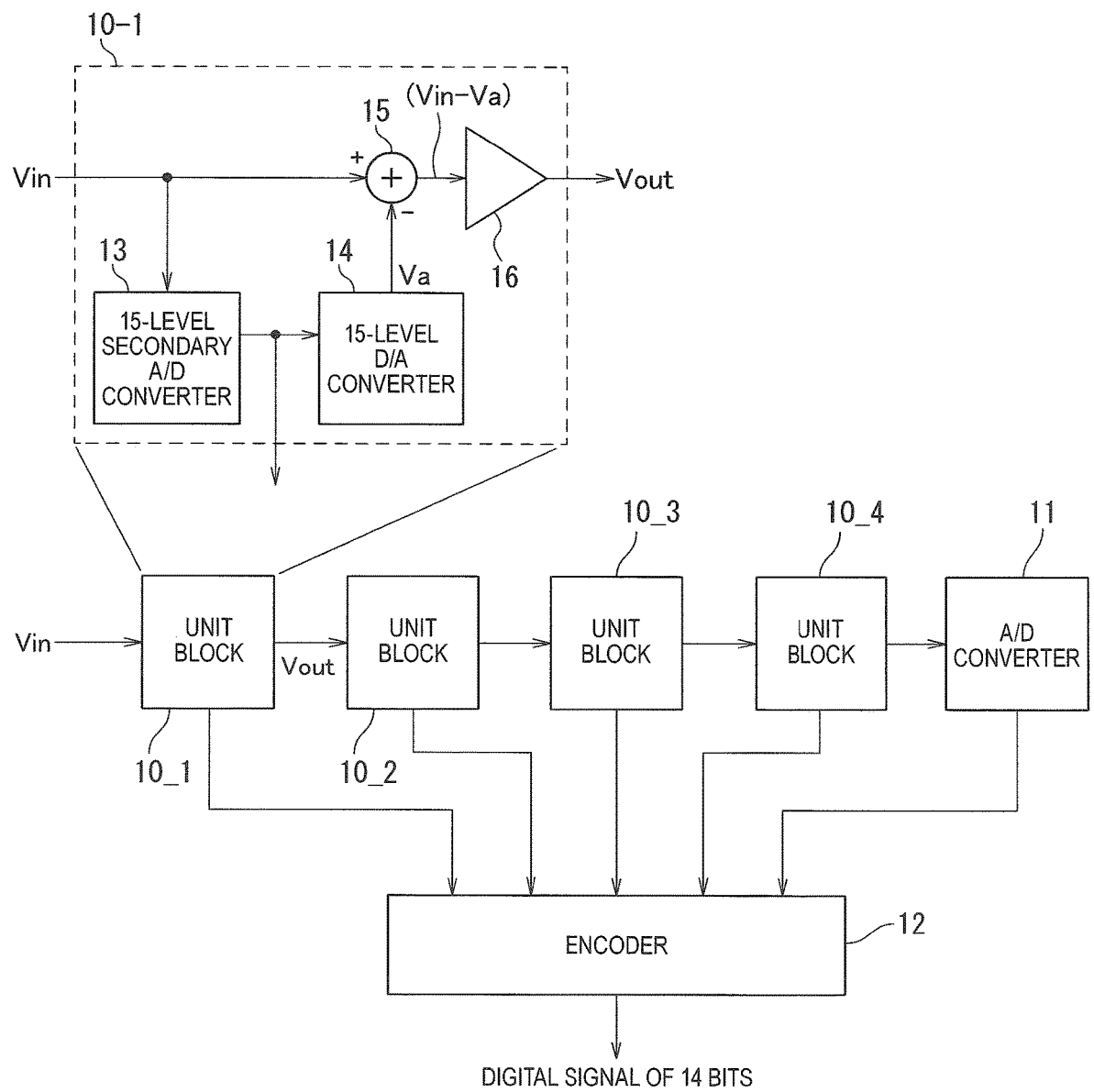
FIG. 17 is a diagram illustrating an example of a pipeline type A/D converter according to the related technology.

A pipeline type A/D converter as the related art includes unit blocks 10-1 to 10-4, an A/D converter 11, and an encoder 12 as illustrated in FIG. 17. Each of the unit blocks includes a secondary A/D converter 13, a D/A converter 14, a subtractor 15, and an amplifier 16. The secondary A/D converter converts an analog signal Vin input into each unit block into a digital signal. The secondary A/D converter of a general pipeline type A/D converter uses a flash type A/D converter consisting of a plurality of comparators having different thresholds. This is because the flash type A/D converter does not have conversion delay as in a successive-approximation type A/D converter and can perform conversion at high speed.

Because signals are sequentially propagated from the first unit block to the next unit block in synchronization with clocks in the pipeline type A/D converter, signal propagation processing between the unit blocks causes conversion delay. The conversion delay can be shortened when reducing the number of the unit blocks, but conversion cannot be performed into a digital signal with the desired number of bits. For that reason, it is necessary to increase bit resolution in each unit block as the number of the unit blocks is decreased. However, the number of comparators is exponentially increased when a bit width in the flash type A/D converter is increased, and thus power consumption and cost is increased. For example, the number of comparators required for a 2-bit flash A/D converter is three, but a 3-bit flash type A/D converter requires seven comparators. Specifically, a n-bit flash type A/D converter requires $2^n-1$ comparators.

On the contrary, the pipeline type A/D converter disclosed in PTL 2 is constituted by a successive-approximation type A/D converter (referred to as "SAR" in PTL 2) that is an A/D converter with reduced circuit area by low power consumption.

Figure 18:
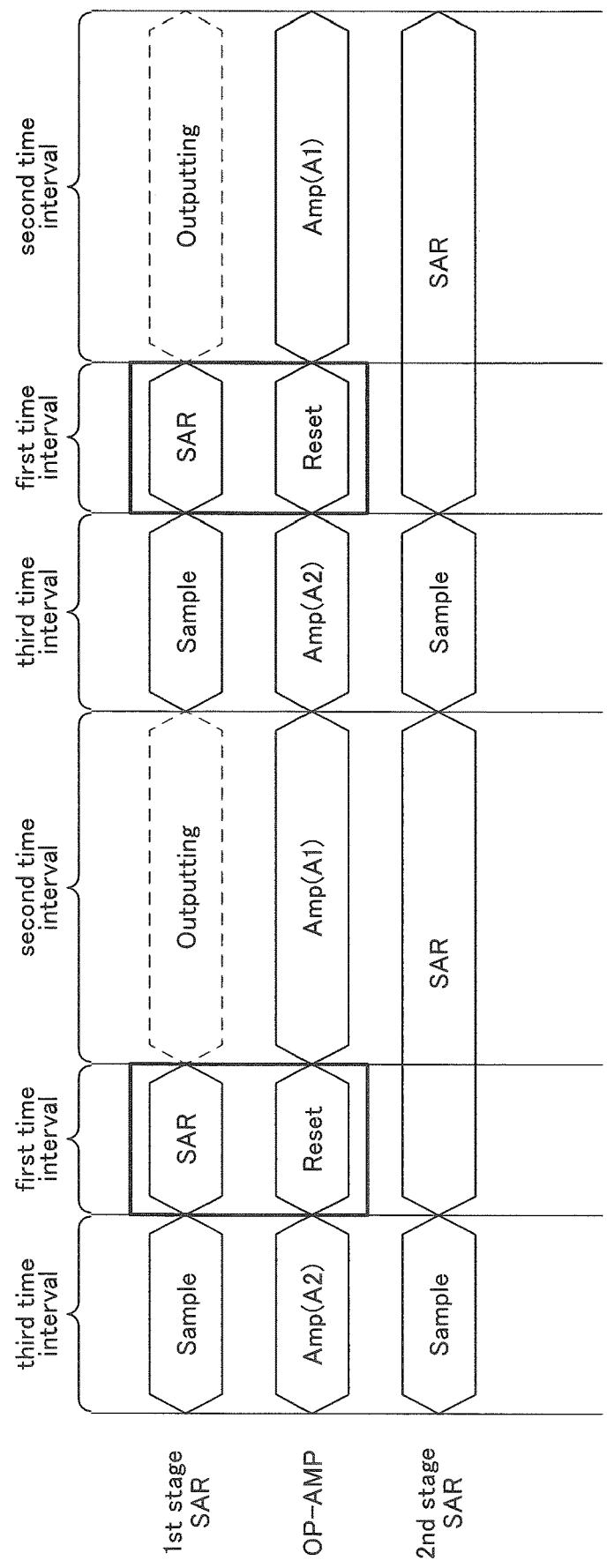
FIG. 18 is a diagram illustrating an operation example of a pipeline type A/D converter using a successive-approximation type A/D converter according to the related technology.

As illustrated in FIG. 18, as successive approximation processing, the pipeline type A/D converter performs three processes of Sample (sample processing of signal to be converted), SAR (successive approximation), and Outputting (result output). Because the successive approximation processing needs to perform the three processes, as illustrated by a portion surrounded with a rectangular box in FIG. 18, for example, a period to wait for the operation end of the SAR exists due to a Reset operation etc. of an OP-AMP in an analog adder/subtractor within the operating period of the SAR.

Conventionally, there is disclosed a successive-approximation type A/D converter having a configuration of simultaneously realizing a sample hold function and a D/A conversion function, for example (see PTL 3).

Figure 19:
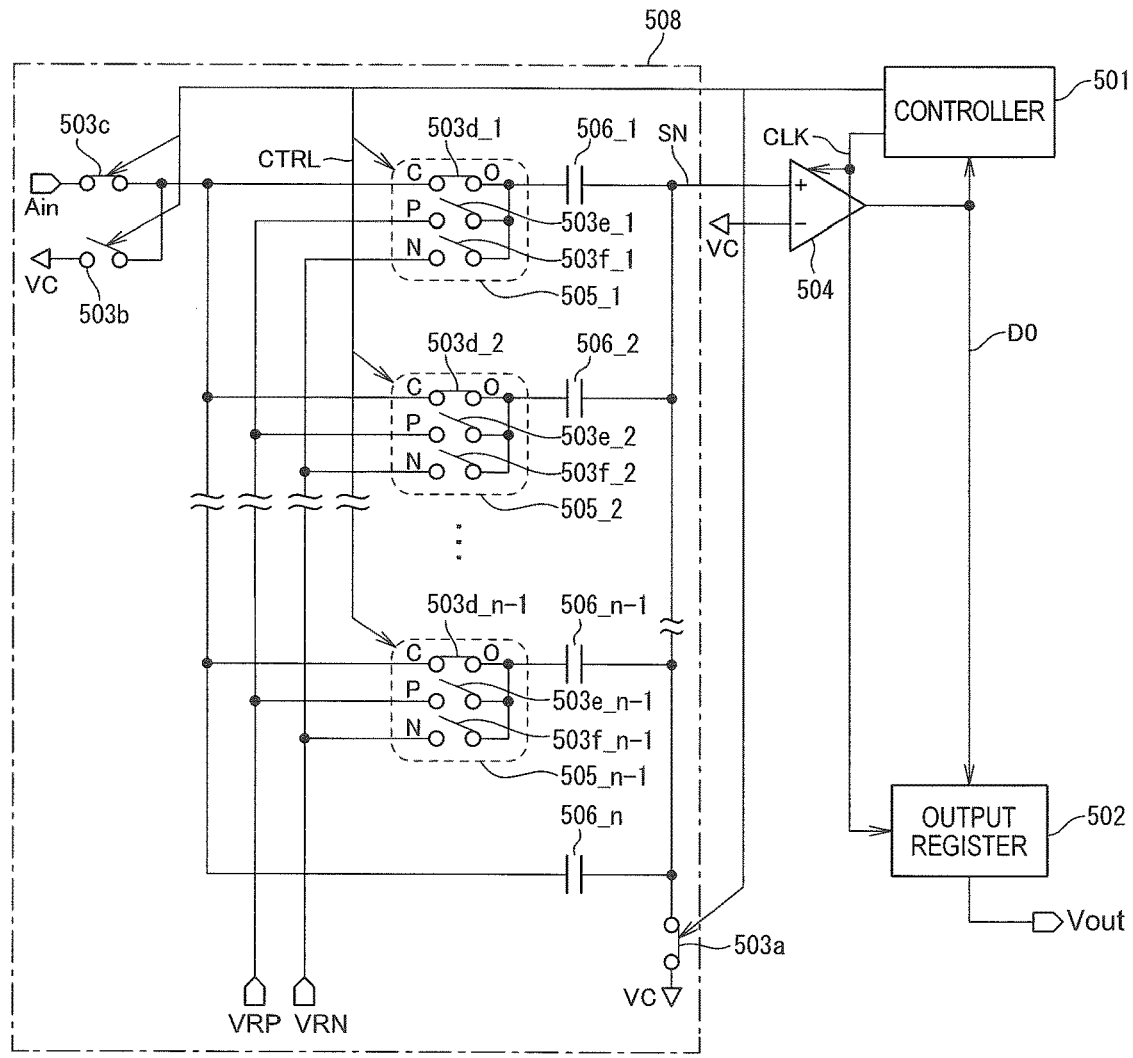
FIG. 19 is a diagram illustrating an example of a basic configuration of the successive-approximation type A/D converter according to the related technology.
Figure 20:
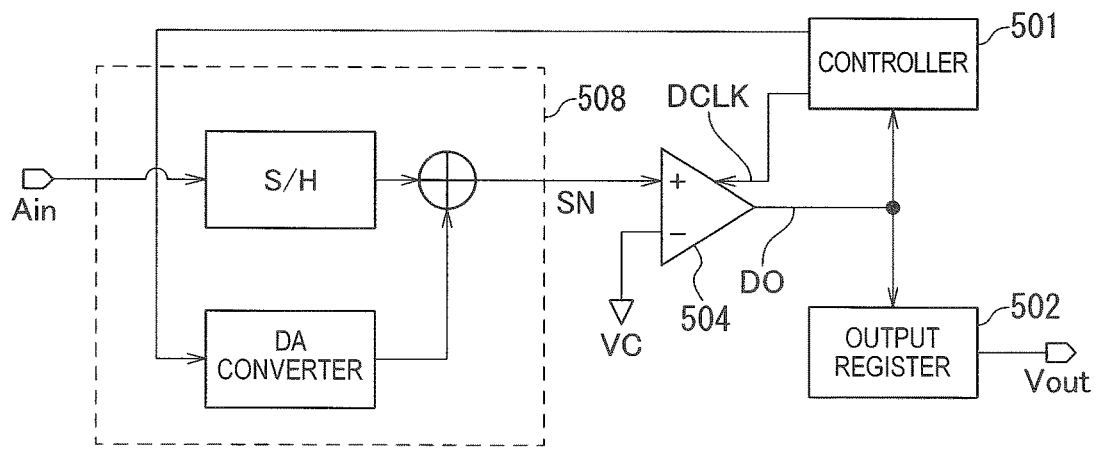
FIG. 20 is a diagram illustrating an example of a specific configuration of the successive-approximation type A/D converter according to the related technology.

Herein, FIG. 19 is a circuit diagram illustrating an example of a conventional charge comparison type successive-approximation type A/D converter. FIG. 20 is a diagram obtained by blocking the circuit diagram of FIG. 19 for each function.

The successive-approximation type A/D converter illustrated in FIG. 19 converts an analog input signal Ain into a digital output Vout of n bits (n is a natural number of 3 or more). In FIG. 20, S/H is a sample hold circuit, and a D/A converter is a circuit configured to convert a digital value into an analog value. As illustrated in the circuit diagram of FIG. 19, the S/H and the D/A converter are generally realized by sharing a capacitor in many cases. In other words, after sampling an analog input voltage on a capacitor, D/A conversion and addition/subtraction are performed by using the capacitor.

Figure 21:
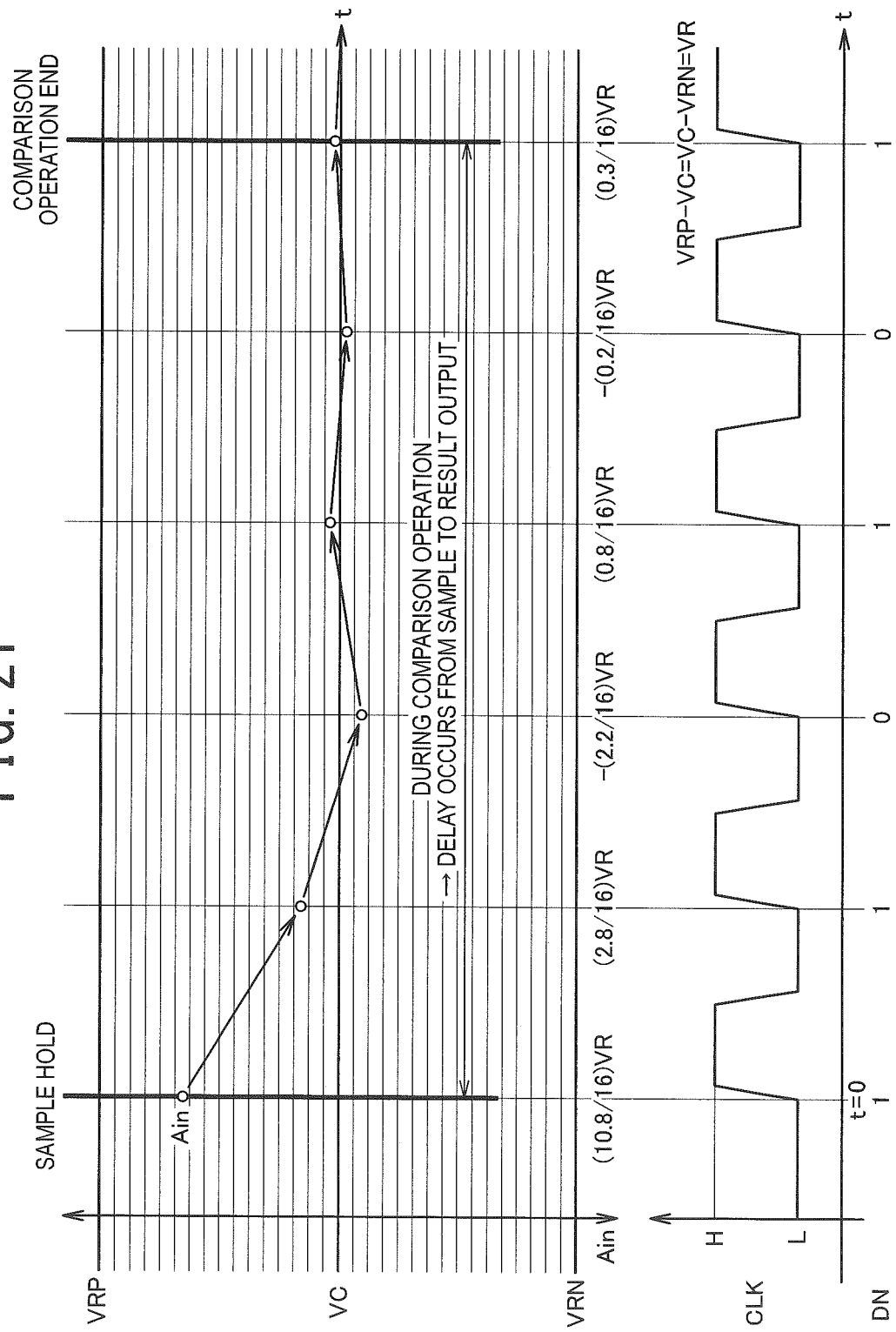
FIG. 21 is a timing chart of each signal of the successive-approximation type A/D converter illustrated in FIG. 20.

In the successive-approximation type A/D converter of PTL 3, after preliminarily sampling the analog input signal Ain, the comparison operation is sequentially performed on the sampled analog input signal Ain while changing the value of the D/A converter and the digital conversion result is finally obtained. Herein, FIG. 21 is a diagram illustrating an example of a time change in a determined voltage, a clock signal waveform, and a determination result during comparison operation of the successive-approximation type A/D converter in PTL 3 (FIG. 19). An example of plotting the determined voltage, an example of a clock signal CLK, and an example of the value of a determination result DN are illustrated in FIG. 21.

In other words, because the successive-approximation type AD converter in PTL 3 realizes a D/A conversion function and a sample hold function by using one circuit as illustrated in FIG. 19, the successive-approximation type AD converter requires to perform processing in a time-division manner. For that reason, as indicated by the period of the double-headed arrow line in FIG. 21, there is a delay from the sampling of the analog input signal Ain to the termination of the comparison operation with respect to the determined voltage generated based on the sampled analog input signal Ain. In other words, the conventional successive-approximation type AD converter has the delay of the period indicated by the double-headed arrow line in FIG. 21 from the sampling of the analog input signal Ain to the output of the AD conversion result of the analog input signal Ain. This is the same in the pipeline type AD converter disclosed in PTL 2 using a successive-approximation type AD converter as a secondary AD converter, and a delay exists from the sampling of the analog input voltage to the termination of the comparison operation.

On the contrary, a successive-approximation type AD converter and a pipeline type AD converter according to each embodiment of the present invention have a configuration without delay due to sample hold.

First Embodiment

[Basic Configuration]

Figure 1A:
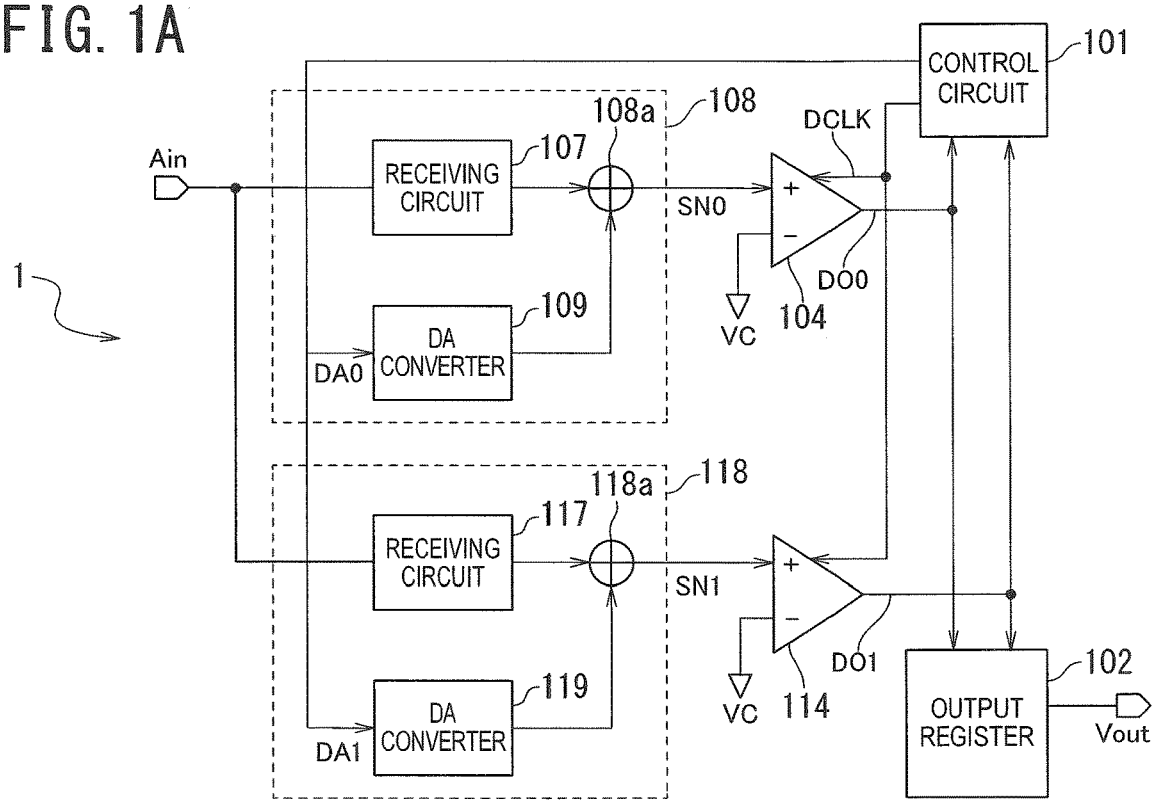
FIGS. 1A and 1B are diagrams illustrating a basic configuration of a successive-approximation type AD converter according to the first embodiment.
Figure 1B:
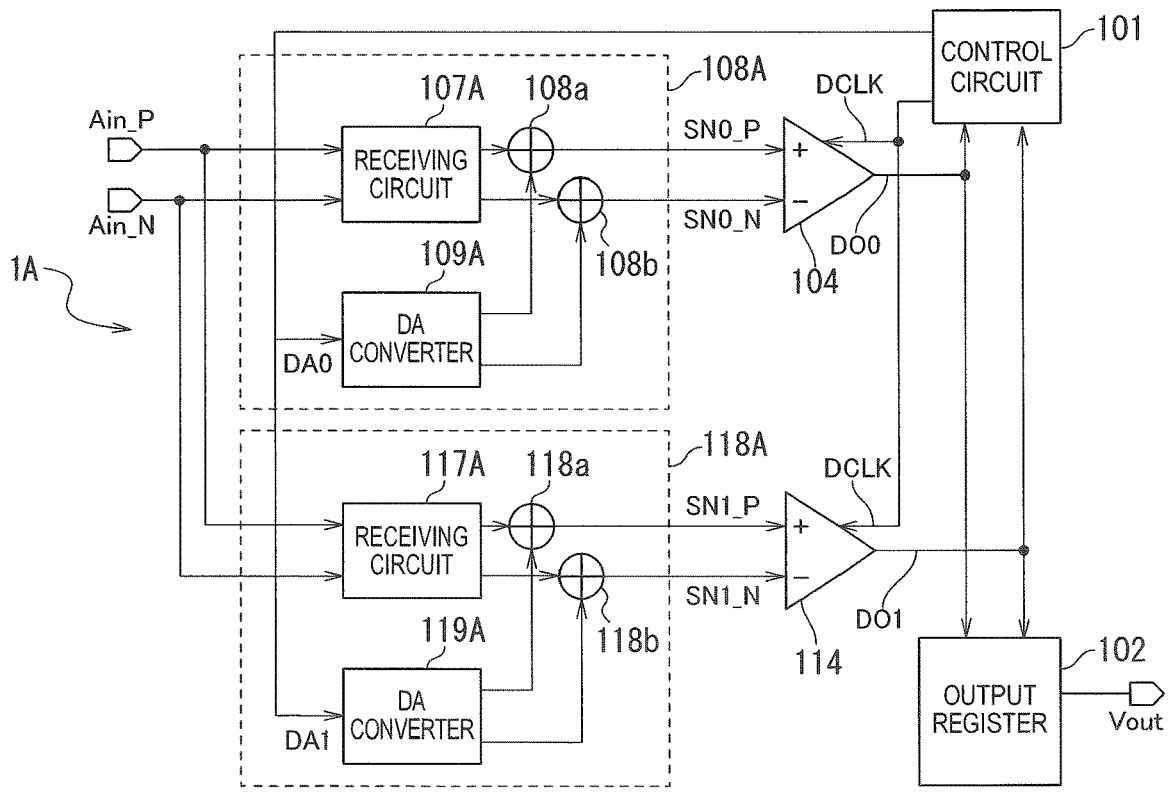

First, a basic configuration of a successive-approximation type AD converter according to the first embodiment of the present invention will be explained based on FIGS. 1A and 1B. FIG. 1A is a diagram illustrating a basic configuration of the successive-approximation type AD converter having a single-ended configuration according to the first embodiment and FIG. 1B is a diagram illustrating a basic configuration of the successive-approximation type AD converter having a differential configuration according to the first embodiment.

As illustrated in FIG. 1A, a successive-approximation type AD converter 1 having the single-ended configuration according to the first embodiment includes a control circuit 101, an output register 102, comparators 104 and 114, and comparison switched capacitor circuits 108 and 118. Herein, the control circuit 101 corresponds to a reference value arithmetic circuit described in the claims, the output register 102 corresponds to an output circuit described in the claims, and the comparators 104 and 114 correspond to a determining circuit described in the claims.

The comparison switched capacitor circuit 108 includes a receiving circuit 107, a subtractor 108a, and a DA converter 109. The comparison switched capacitor circuit 118 includes a receiving circuit 117, a subtractor 118a, and a DA converter 119. In addition, DA0 and DA1 in FIG. 1A are control values generated by the control circuit 101 and are for controlling the DA converters 109 and 119. Herein, the subtractors 108a and 118a correspond to a subtraction signal calculation circuit described in the claims and the control values DA0 and DA1 correspond to a reference value described in the claims.

The receiving circuits 107 and 117 output signals according to an analog input signal Ain input into a signal input terminal Ain, and for example, are an adjusting circuit necessary for adjusting the analog input signal Ain to a desired amplitude or adding and subtracting the analog input signal to and from the output signals of the DA converters 109 and 119. Hereinafter, signals according to the analog input signal Ain output from the receiving circuits 107 and 117 are referred to as an "analog input signal AinO". Herein, the analog input signal Ain corresponds to a first analog input signal described in the claims and the analog input signal AinO corresponds to a second analog input signal described in the claims.

In the first embodiment, assuming that the analog input signal Ain and the analog input signal AinO are equivalent to each other, the analog input signal AinO output from the receiving circuits 107 and 117 is hereinafter referred to as "the analog input signal Ain".

In the single-ended configuration, subtraction signals between the analog input signal Ain output from the receiving circuits 107 and 117 and the output signals of the DA converters 109 and 119 are computed by the subtractors 108a and 118a. Then, the subtraction signals output from the subtractors 108a and 118a are input into the noninverting input terminals of the comparators 104 and 114. Hereinafter, the signal voltage of the subtraction signal between the analog input signal Ain and the output signal of the DA converter 109 is referred to as a "subtraction voltage SN0", and the signal voltage of the subtraction signal between the analog input signal Ain and the output signal of the DA converter 119 is referred to as a "subtraction voltage SN1".

The comparator 104 compares the subtraction voltage SN0 with a reference voltage VC, and the comparator 114 compares the subtraction voltage SN1 with the reference voltage VC. Herein, the reference voltage VC corresponds to a first reference voltage described in the claims. Then, a magnitude relationship between the subtraction voltages SN0 and SN1 and the reference voltage VC is determined based on these comparison results. Based on the comparison results DO0 and DO1, the control circuit 101 updates the control values DA0 and DA1 so that the output signals of the DA converters 109 and 119 approach the analog input signal Ain. Moreover, based on comparison results DO0_1 to DO0_$n$ and DO1_1 to DO1_$n$ of a high-low relationship that are performed n times (n is a natural number of 3 or more, the same applies hereinafter), the output register 102 according to the first embodiment computes a digital output signal Vout of (n+1) bits corresponding to the analog input signal Ain. Herein, the comparison results DO0 and DO1 correspond to a determination result described in the claims.

On the other hand, as illustrated in FIG. 1B, a successive-approximation type AD converter 1A having the differential configuration according to the first embodiment has a configuration that the comparison switched capacitor circuits 108 and 118 are partially different from the successive-approximation type AD converter 1 having the single-ended configuration. In other words, in the differential configuration, the successive-approximation type AD converter 1A includes comparison switched capacitor circuits 108A and 118A instead of the comparison switched capacitor circuits 108 and 118. The comparison switched capacitor circuit 108A includes a receiving circuit 107A, subtractors 108a and 108b, and a DA converters 109A. The comparison switched capacitor circuit 118A includes a receiving circuit 117A, subtractors 118a and 118b, and a DA converters 119A.

The receiving circuits 107A and 117A are an adjusting circuit necessary for adjusting analog input signals Ain_P and Ain_N with a reversed phase relationship input into signal input terminals Ain_P and Ain_N to a desired amplitude or adding and subtracting the analog input signals to and from the outputs of the DA converters 109A and 119A. Hereinafter, signals corresponding to the analog input signals Ain_P and Ain_N output from the receiving circuits 107A and 117A are referred to as "analog input signals AinO_P and AinO_N". Herein, the analog input signals Ain_P and Ain_N correspond to a first analog input signal described in the claims, and the analog input signals AinO_P and AinO_N correspond to a second analog input signal described in the claims.

In the first embodiment, assuming that the analog input signals Ain_P and Ain_N are equivalent to the analog input signals AinO_P and AinO_N, the analog input signals AinO_P and AinO_N output from the receiving circuits 107A and 117A are hereinafter referred to as "the analog input signals Ain_P and Ain_N".

In the differential configuration, subtraction signals between the analog input signal AinO_P output from the receiving circuits 107A and 117A and the output signals of the DA converters 109A and 119A are computed by the subtractors 108a and 118a. Moreover, subtraction signals between the analog input signal AinO_N output from the receiving circuits 107A and 117A and the output signals of the DA converters 109A and 119A are computed by the subtractors 108b and 118b.

Then, the subtraction signals output from the subtractors "108a and 118a" and "108b and 118b" are input into the noninverting input terminals of the comparators 104 and 114. Hereinafter, the voltages of the subtraction signals between the analog input signals Ain_P and Ain_N and the output signal of the DA converter 109A are referred to as "subtraction voltages SN0_P and SN0_N". Moreover, the voltages of the subtraction signals between the analog input signals Ain_P and Ain_N and the output signal of the DA converter 119A are referred to as "subtraction voltages SN1_P and SN1_N".

The comparator 104 compares the subtraction voltage SN0_P with the subtraction voltage SN0_N, and the comparator 114 compares the subtraction voltage SN1_P with the subtraction voltage SN1_N. Then, the comparators determine a high-low relationship between the subtraction voltage SN0_P and the subtraction voltage SN0_N and a high-low relationship between the subtraction voltage SN1_P and the subtraction voltage SN1_N. Herein, the subtraction voltage SN0_N and the subtraction voltage SN1_N correspond to a reference voltage described in the claims. In addition, the reference voltage is different from the reference voltage VC used in the single-ended configuration.

In addition, resistance to common mode noise and external interference is higher than that of the single-ended configuration by employing the differential configuration.

Each of the successive-approximation type AD converters 1 and 1A according to the first embodiment includes two sets of which each has a comparator and a comparison switched capacitor circuit, but the first embodiment is not limited to this configuration. For example, each of the AD converters may include one set having a comparator and a comparison switched capacitor circuit or three sets or more of which each has a comparator and a comparison switched capacitor circuit. Moreover, the successive-approximation type AD converter 1 having the single-ended configuration will be explained below in detail.

Specific Configuration Example of the Successive-Approximation Type AD Converter 1

The successive-approximation type AD converter 1 according to the first embodiment AD-converts the analog input signal Ain into the digital output signal Vout of (n+1) bits.

Figure 2:
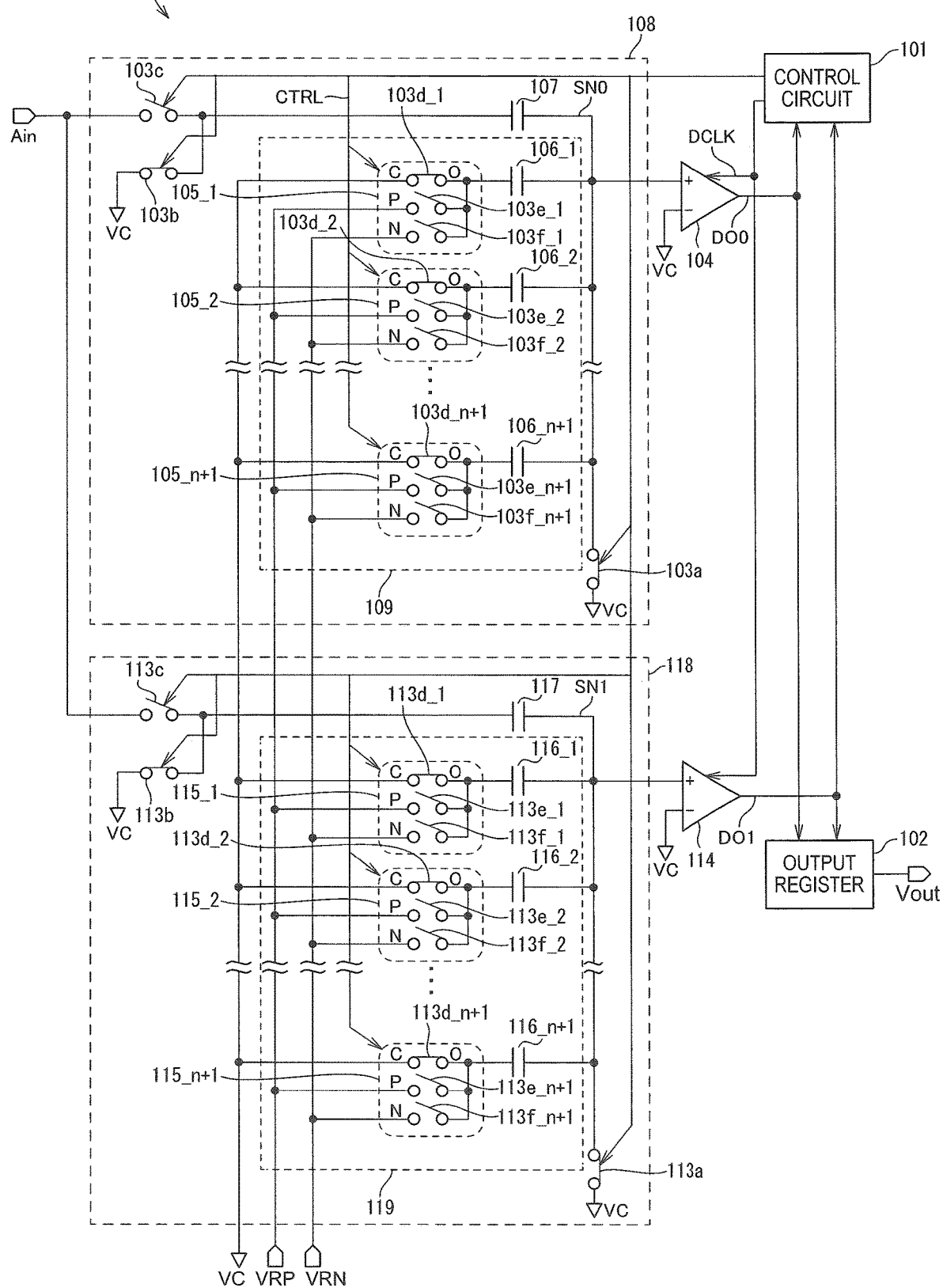
FIG. 2 is a diagram illustrating a specific configuration of the successive-approximation type AD converter having the single-ended configuration according to the first embodiment.

As illustrated in FIG. 2, the successive-approximation type AD converter 1 includes the control circuit 101, the output register 102, the comparators 104 and 114, and the comparison switched capacitor circuits 108 and 118.

The comparison switched capacitor circuit 108 includes switches 103a to 103c, the receiving circuits 107, a storage node SN0, and the DA converters 109. Herein, the switch 103c corresponds to a first switch circuit described in the claims.

In the first embodiment, the receiving circuit 107 is constituted by a capacitor having an electrostatic capacity Cin. The receiving circuit 107 has a role to supply (add) the analog input signal Ain input into the signal input terminal Ain to the storage node SN0 that is the input node of the comparator 104. Herein, the capacitor having the electrostatic capacity Cin constituting the receiving circuit 107 corresponds to a first capacitive element described in the claims.

The DA converter 109 includes switch groups 105_1 to 105_(n+1) and capacitors 106_1 to 106_(n+1). Herein, the switch groups 105_1 to 105_(n+1) correspond to a second switch circuit described in the claims, and the capacitors 106_1 to 106_(n+1) correspond to the second to L-th capacitive elements (L is a natural number of 3 or more, the same applies hereinafter) described in the claims.

The capacitor 106_1 is a capacitor whose electrostatic capacity is set to a reference capacity C. Moreover, the capacitors 106_2 to 106_(n+1) are capacitors whose electrostatic capacities are set to capacities (C/2, C/4, . . . , and $C/2^n$) obtained by weighting the reference capacity C by the reciprocal of a power of two.

For example, in the case of "n=4", the electrostatic capacities of the capacitors 106_1 to 106_5 are respectively "C, C/2, C/4, C/8, and C/16".

Each of the switch groups 105_1 to 105_(n+1) includes three switches of a switch 103d_k (k is a natural number of 1 to (n+1)), a switch 103e_k, and a switch 103f_k. Hereinafter, the switch 103d_k, the switch 103e_k, and the switch 103f_k may be abbreviated as "the switches 103d_k to 103f_k".

Specifically, each of the switch groups 105_1 to 105_(n+1) includes switches 103d_k to 103f_k whose k has the same number as the tail ends (1 to (n+1)) of the switch groups.

For example, in the case of the switch group 105_1, the switch group includes three switches of the switch 103d_1, the switch 103e_1, and the switch 103f_1. Moreover, in the case of the switch group 105_(n+1), the switch group includes three switches of the switch 103d_(n+1), the switch 103e_(n+1), and the switch 103f_(n+1).

The switches 103d_k to 103f_k are constituted by switching elements such as MOS transistors, and includes a common terminal O to which the right ends of the switches are connected.

A terminal C is formed at the left end of each of the switches 103d_1 to 103d_(n+1), a terminal P is formed at the left end of each of the switches 103e_1 to 103e_(n+1), and a terminal N is formed at the left end of each of the switches 103f_1 to 103f_(n+1).

The common terminal O of the switches 103d_k to 103f_k is connected to the left end of the capacitor 106_k.

Specifically, the common terminal O of the switches 103d_1 to 103f_1 is connected to the left end of the capacitor 106_1, the common terminal O of the switches 103d_2 to 103f_2 is connected to the left end of the capacitor 106_2, . . . , and the common terminal O of the switches 103d_(n+1) to 103f_(n+1) is connected to the left end of the capacitor 106_(n+1).

The terminals C of the switches 103d_1 to 103d_(n+1) are connected to a first reference voltage terminal VC having a first reference voltage VC. The first reference voltage VC is set to 0V, for example.

The terminals P of the switches 103e_1 to 103e_(n+1) are connected to a second reference voltage terminal VRP having a second reference voltage VRP that is a positive full-scale reference voltage when the first reference voltage VC is used as a reference.

Moreover, the terminals N of the switches 103f_1 to 103f_(n+1) are connected to a third reference voltage terminal VRN having a third reference voltage VRN that is a negative full-scale reference voltage when the first reference voltage VC is used as a reference.

In other words, in the present embodiment, by using the first reference voltage VC as a reference (center), a range from the negative third reference voltage VRN to the positive second reference voltage VRP becomes the range of a full-scale reference voltage.

Then, each of the switches 103d_1 to 103d_(n+1) switches between the On/Off states in accordance with a control signal CTRL from the control circuit 101 to short-circuit the terminal C and the terminal O in the On state. This makes it possible to connect the left ends of the capacitors 106_1 to 106_(n+1) to the first reference voltage terminal VC.

Moreover, each of the switches 103e_1 to 103e_(n+1) switches between the On/Off states in accordance with the control signal CTRL from the control circuit 101 to short-circuit the terminal P and the terminal O in the On state. This makes it possible to connect the left ends of the capacitors 106_1 to 106_(n+1) to the second reference voltage terminal VRP.

Each of the switches 103f_1 to 103f_(n+1) switches between the On/Off in accordance with the control signal CTRL from the control circuit 101 to short-circuit the terminal N and the terminal O in the On state. This makes it possible to connect the left ends of the capacitors 106_1 to 106_(n+1) to the third reference voltage terminal VRN.

The storage node SN0 is a node capable of storing electric charge, which is formed at a connection point between the right ends of the capacitors 106_1 to 106_(n+1), the non-inverting input terminal of the comparator 104, the upper end of the switch 103a, and the right end of the capacitor (hereinafter, the receiving circuit 107 is also referred to as "the capacitor 107") constituting the receiving circuit 107.

When the switches 103a and 103b are turned off and the switch 103c is turned on by the connection configuration of the various capacitors 106 and 107 and the various switches 103a to 103f described above, a function equivalent to the subtractor 108a is exerted. In other words, in this connection state, the storage node SN0 holds a subtraction voltage SN0 that is a voltage obtained by adding or subtracting the holding voltage (the output voltage of the DA converter 109) of the capacitors 106_1 to 106_(n+1) to or from the holding voltage (the voltage of the analog input signal Ain) of the capacitor 107 in accordance with the polarity.

The switch 103a is constituted by a switching element such as a MOS transistor, and its upper end is connected to the storage node SN0 and its lower end is connected to the first reference voltage terminal VC having the first reference voltage VC. Herein, the switch 103a switches between the On/Off states in accordance with the control signal CTRL from the control circuit 101 to connect the storage node SN0 to the first reference voltage terminal VC in the On state.

The switch 103b is constituted by a switching element such as a MOS transistor, and its right end is connected to the right end of the switch 103c and the left end of the receiving circuit 107 and its left end is connected to the first reference voltage terminal VC. Herein, the switch 103b switches between the On/Off states in accordance with the control signal CTRL from the control circuit 101 to connect the left end of the receiving circuit 107 to the first reference voltage terminal VC in the On state.

The switch 103c is constituted by a switching element such as a MOS transistor, and its right end is connected to the right end of the switch 103b and the left end of the receiving circuit 107 and its left end is connected to the signal input terminal Ain of the analog input signal Ain. Herein, the switch 103c switches between the On/Off in accordance with the control signal CTRL from the control circuit 101 to connect the left end of the receiving circuit 107 to the signal input terminal Ain in the On state.

In addition, a switching operation is controlled (non-overlap control) so that the switch 103b and the switch 103c are not simultaneously in the On state.

On the other hand, the comparison switched capacitor circuit 118 includes switches 113a to 113c, the receiving circuit 117, a storage node SN1, and the DA converter 119.

In the first embodiment, the receiving circuit 117 is constituted by a capacitor having the same electrostatic capacity Cin as that of the receiving circuit 107. With such a configuration, the receiving circuit 117 has a role to supply (add) the analog input signal Ain input into the signal input terminal Ain to the storage node SN1 that is the input node of the comparator 114.

The DA converter 119 includes switch groups 115_1 to 115_(n+1) and capacitors 116_1 to 116_(n+1). Herein, the switch groups 115_1 to 115_(n+1) correspond to a second switch circuit described in the claims, and the capacitors 116_1 to 116_(n+1) correspond to the second to Lth capacitive elements described in the claims.

The capacitors 116_1 to 116_(n+1) have the same configuration as the capacitors 106_1 to 106_(n+1).

Each of the switch groups 115_1 to 115_(n+1) includes three switches of switches 113d_k, switches 113e_k, and switches 113f_k. Hereinafter, the switch 113d_k, the switch 113e_k, and the switch 113f_k may be abbreviated as "the switches 113d_k to 113f_k".

The switches 113d_k to 113f_k have the same configuration as the switches 103d_k to 103f_k. In other words, a terminal C is formed at the left end of each of the switches 113d_1 to 113d_(n+1), a terminal P is formed at the left end of each of the switches 113e_1 to 113e_(n+1), and a terminal N is formed at the left end of each of the switches 113f_1 to 113f_(n+1). A common terminal O of the switches 113d_k to 113f_k is connected to the left end of the capacitor 116_k, the terminal C is connected to the first reference voltage terminal VC, the terminal P is connected to the second reference voltage terminal VRP, and the terminal N is connected to the third reference voltage terminal VRN.

Each of the switches 113d_1 to 113d_(n+1) switches between the On/Off states in accordance with the control signal CTRL from the control circuit 101 to short-circuit the terminal C and the terminal O in the On state. This makes it possible to connect the left ends of the capacitors 116_1 to 116_(n+1) to the first reference voltage terminal VC.

Moreover, each of the switches 113e_1 to 113e_(n+1) switches between the On/Off states in accordance with the control signal CTRL from the control circuit 101 to short-circuit the terminal P and the terminal O in the On state. This makes it possible to connect the left ends of the capacitors 116_1 to 116_(n+1) to the second reference voltage terminal VRP.

Each of the switches 113f_1 to 113f_(n+1) switches between the On/Off states in accordance with the control signal CTRL from the control circuit 101 to short-circuit the terminal N and the terminal O in the On state. This makes it possible to connect the left ends of the capacitors 116_1 to 116_(n+1) to the third reference voltage terminal VRN. The storage node SN1 is a node capable of storing electric charge, which is formed at a connection point between the right ends of the capacitors 116_1 to 116_(n+1), the noninverting input terminal of the comparator 114, the upper end of the switch 113a, and the right end of the capacitor (hereinafter, the receiving circuit 117 is also referred to as "the capacitor 117") constituting the receiving circuit 117.

When the switches 113a and 113b are turned off and the switches 113c is turned on by the connection configuration of the various capacitors 116 and 117 and the various switches 113a to 113f described above, a function equivalent to the subtractor 118a is exerted. In other words, in this connection state, the storage node SN1 holds a subtraction voltage SN1 that is a voltage obtained by adding or subtracting the holding voltage (the output voltage of the DA converter 119) of the capacitors 116_1 to 116_(n+1) to or from the holding voltage (the voltage of the analog input signal Ain) of the capacitor 117 in accordance with the polarity.

The switch 113a is constituted by a switching element such as a MOS transistor, and its upper end is connected to the storage node SN1 and its lower end is connected to the first reference voltage terminal VC. Herein, the switch 113a switches between the On/Off states in accordance with the control signal CTRL from the control circuit 101 to connect the storage node SN1 to the first reference voltage terminal VC in the On state.

The switch 113b is constituted by a switching element such as a MOS transistor, and its right end is connected to the right end of the switch 113c and the left end of the receiving circuit 117 and its left end is connected to the first reference voltage terminal VC. Herein, the switch 113b switches between the On/Off states in accordance with the control signal CTRL from the control circuit 101 to connect the left end of the receiving circuit 117 to the first reference voltage terminal VC in the On state.

The switch 113c is constituted by a switching element such as a MOS transistor, and its right end is connected to the right end of the switch 113b and the left end of the receiving circuit 117 and its left end is connected to the signal input terminal Ain of the analog input signal Ain. Herein, the switch 113c switches between the On/Off states in accordance with the control signal CTRL from the control circuit 101 to connect the left end of the receiving circuit 117 to the signal input terminal Ain in the On state.

In addition, non-overlap control is performed on the switch 113b and the switch 113c.

Based on the comparison results DO0 and DO1 of the comparators 104 and 114, the control circuit 101 has a function of generating the control signal CTRL for controlling switching operations between the switches 103a to 103c and 113a to 113c and the switch groups 105_1 to 105_(n+1) and 115_1 to 115_(n+1).

The control signal CTRL includes control values NEG and Di generated based on the control values DA0 and DA1. In addition, "i" is a natural number from 1 to (n+1). Moreover, "NEG" means the polarity of a signal and "Di" means the absolute value of a signal. Specifically, NEG has a meaning of "Negative", and indicates a positive when "NEG=0" and a negative when "NEG=1". Herein, the control signal CTRL corresponds to a reference value described in the claims.

The output register 102 has a function of holding signal values (DO0_1 to DO0_$n$ and DO1_1 to DO1_$n$) indicating the comparison results output from the comparators 104 and 114. Additionally, based on the held comparison results DO0_1 to DO0_$n$ and DO1_1 to DO1_$n$, the output register has a function of generating the digital output signal Vout of (n+1) bits and outputting the generated digital output signal Vout.

In accordance with a rising edge of a clock signal DCLK from the control circuit 101, the comparator 104 compares the subtraction voltage SN0 input into its noninverting input terminal with the reference voltage VC (the same as the first reference voltage VC) input into its inverting input terminal. Then, when "SN0≥VC", a high-level signal ("DO0_M=1") is output as the comparison result DO0_M (M is a natural number from 1 to n). Moreover, when "SN0<VC", a low-level signal ("DO0_M=0") is output as the comparison result DO0_M.

In accordance with the rising edge of the clock signal DCLK from the control circuit 101, the comparator 114 compares the subtraction voltage SN1 input into its noninverting input terminal with the reference voltage VC input into its inverting input terminal. Then, when "SN1≥VC", a high-level signal ("DO1_M=1") is output as the comparison result DO1_M. Moreover, when "SN1<VC", a low-level signal ("DO1_M=0") is output as the comparison result DO1_M.

[Outline of Operation of the Successive-Approximation Type AD Converter 1]

Next, the outline of the operation of the successive-approximation type AD converter 1 according to the first embodiment will be explained.

The successive-approximation type AD converter 1 according to the first embodiment can obtain the digital output signal Vout that is the AD conversion result of the analog input signal Ain by performing operations described in the following (1) to (6).

(1) The control circuit 101 turns on the switches 103a, 103b, and 103d_1 to 103d_(n+1) to initialize the electric charges of the capacitors 106_1 to 106_(n+1). Similarly, the control circuit turns on the switches 113a, 113b, and 113d_1 to 113d_(n+1) to initialize the electric charges of the capacitors 116_1 to 116_(n+1).

(2) The control circuit 101 turns off the switches 103a and 103b and turns on the switch 103c so that the analog input signal Ain input into the signal input terminal Ain is transmitted to the input terminal of the comparator 104 via the receiving circuit 107. At the same time, the control circuit turns on any switch in the switch groups 105_1 to 105_(n+1) so that the output voltage of the DA converter 109 becomes a desired comparison voltage (described later).

Similarly, the control circuit 101 turns off the switches 113a and 113b and turns on the switch 113c so that the analog input signal Ain input into the signal input terminal Ain is transmitted to the input terminal of the comparator 114 via the receiving circuits 117. At the same time, the control circuit turns on any switch in the switch groups 115_1 to 115_(n+1) so that the output voltage of the DA converter 119 becomes a desired comparison voltage (described later).

Herein, the comparison voltage is a voltage for a high-low comparison with the signal voltage of the analog input signal Ain. When the signal voltage of the analog input signal Ain is higher than the comparison voltage, the control circuit 101 updates the next comparison voltage to a higher voltage. When the signal voltage of the analog input signal Ain is lower than the comparison voltage, the control circuit updates the next comparison voltage to a lower voltage. Moreover, because the desired comparison voltages output from the DA converters 109 and 119 are different from each other, the switches at different positions are turned on.

(3) The comparator 104 compares the subtraction voltage SN0 held in the storage node SN0 with the reference voltage VC to obtain the comparison result DO0_1. Similarly, the comparator 114 compares the subtraction voltage SN1 held in the storage node SN1 with the reference voltage VC to obtain the comparison result DO1_1. Herein, the first embodiment has a configuration that the comparators 104 and 114 perform a high-low comparison between the reference voltage VC and the subtraction voltages SN0 and SN1 between the voltage of the analog input signal Ain and the comparison voltage to perform a high-low comparison between the voltage of the analog input signal Ain and the comparison voltage.

(4) The output register 102 obtains VO(M) that is a digital output code based on the comparison results DO0_M and DO1_M of the comparators 104 and 114. For example, in the case of the first comparison operation, VO(1) that is the first digital output code is obtained based on the comparison results DO0_1 and DO1_1.

(5) The control circuit 101 repeats the same processing as the above (2) to (4) by (n−1) times while updating the control values DA0 and DA1 to change the comparison voltages. This makes it possible to obtain digital output codes VO(2) to VO(n).

(6) The output register 102 calculates the digital output signal Vout that is the AD conversion result of the analog input signal Ain based on the values of the digital output codes VO(1) to VO(n). Then, the output register outputs the calculated digital output signal Vout. In addition, the successive-approximation type AD converter 1 according to the first embodiment can obtain the AD conversion result of (n+1) bits by the n comparison operations.

[About the Subtraction Voltage SN0 of the Storage Node SN0]

The subtraction voltage SN0 is changed in On/Off states of each switch of the switch groups 105_1 to 105_(n+1) during the processing of the above (2) to (4). Moreover, the subtraction voltage SN0 can be represented by the following Equation (1) when the impact of parasitic capacitance is ignored.

$$SN0 = \frac{Cin}{Ctotal} \cdot Ain - \frac{\sum_{i=1}^{n+1} Ci \cdot Di}{Ctotal} \cdot (1 - 2 \cdot NEG) \cdot \frac{VRP - VRN}{2} + VC \quad (1)$$

Herein, in the above Equation (1), Ctotal is a sum of capacitance values of all capacitors including the capacitor 107 and the capacitors 106_1 to 106_(n+1), and can be represent by the following Equation (2).

$$Ctotal = Cin + \sum_{i=1}^{n+1} Ci$$

In the above Equation (2), Ci is the capacitance value of the capacitor 106_i.

The control values NEG and Di and switches to be turned on among the switches 103d_i to 103f_i of the switch group 105_i have a relationship illustrated in the following Table 1.

TABLE 1

| Operating state | NEG | Di | Switch to be turned on | Voltage of terminal O |
| --- | --- | --- | --- | --- |
| Initialization | 0 or 1 | 0 or 1 | 103d_i | VC |
| Comparison operation | 0 | 1 | 103f_i | VRN |
|  | 0 or 1 | 0 | 103d_i | VC |
|  | 1 | 1 | 103e_i | VRP |

In other words, as illustrated in the above Table 1, NEG and Di are "0 or 1" at initialization and a switch to be turned on is 103d_i. The voltage of the terminal O at this time is the first reference voltage VC. Moreover, when NEG is "0" and Di is "1" during comparison operation, a switch to be turned on is 103f_i. The voltage of the terminal O at this time is the third reference voltage VRN. Moreover, when NEG is "0 or 1" and Di is "0" during comparison operation, a switch to be turned on is 103d_i. The voltage of the terminal O at this time is the first reference voltage VC. Moreover, when NEG is "1" and Di is "1" during comparison operation, a switch to be turned on is 103e_i. The voltage of the terminal O at this time is the second reference voltage VRP.

Moreover, when the control value DA0 is defined by the following Equation (3), the above Equations (1) and (2) can be represented by the following Equations (4) and (5).

$$DA0 = (1 - 2 \cdot NEG) \sum_{i=1}^{n+1} 2^{n+1+i} \quad (3)$$

$$SN0 = \frac{Cin}{Ctotal} \cdot Ain - \frac{\frac{C}{2^n}}{Ctotal} \cdot \frac{VRP - VRN}{2} \cdot DA0 + VC \quad (4)$$

$$Ctotal = Cin + \left(2 - \frac{1}{2^n}\right)C$$

The first term of the above Equation (4) is proportional to the analog input signal Ain. Moreover, the second term of the above Equation (4) is an arbitrary voltage value within the range from $-((C/2^n)/C\text{total}) \cdot ((VRP-VRN)/2)$ to $+((C/2^n)/C\text{total}) \cdot ((VRP-VRN)/2)$.

Figure 4:
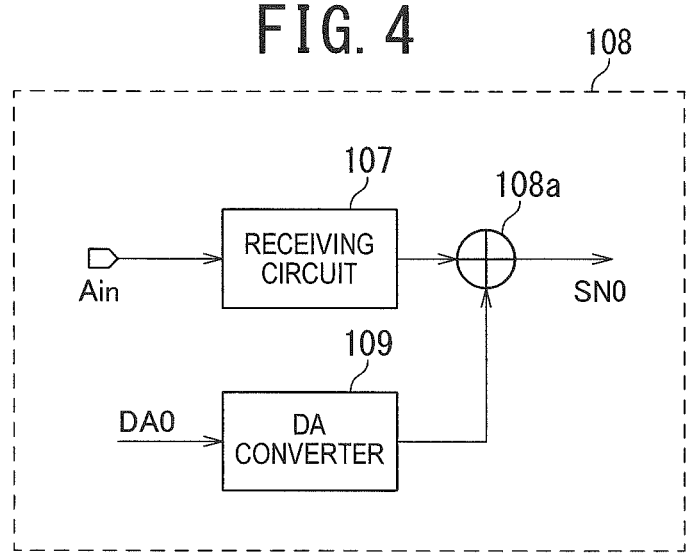
FIG. 4 is a block diagram illustrating a comparison switched capacitor circuit with blocks for each function.

Herein, FIG. 3 is a diagram illustrating a correspondence relationship between the control values "NEG, D1, D2, D3, D4, D5, and DA0" and the value of the second term of the above Equation (4) when "n=4". FIG. 4 is a block diagram illustrating the comparison switched capacitor circuit with blocks for each function.

As illustrated in FIG. 3, when "NEG=0, D1=D2=D3=D4=D5=1, and DA0=31" for example, the second term of the above Equation (4) is "(31/32)·(C/Ctotal)·(VRP-VRN)". On the other hand, when "NEG=1, D1=D2=D3=D4=D5=1, and DA0=-31" for example, the second term of the above Equation (4) is "-(31/32)·(C/Ctotal)·(VRP-VRN)".

In other words, as illustrated in FIG. 4, the comparison switched capacitor circuit 108 can be said to be a circuit configured to output, to the storage node SN0, a voltage (the subtraction voltage SN0) obtained by adding or subtracting a comparison voltage corresponding to the value of the control value DA0 to or from the analog input signal Ain. Because the control value DA0 is a digital value, the comparison switched capacitor circuit 108 can also be called a circuit configured to: DA-convert the digital control value DA0 into an analog value to generate an analog comparison signal; and add or subtract the analog comparison signal to or from the analog input signal Ain to output the result. Herein, the analog comparison signal corresponds to an analog reference signal described in the claims.

In addition, because the comparison switched capacitor circuit 118 has the same configuration as the comparison switched capacitor circuit 108, the description for the subtraction voltage SN1 of the storage node SN1 is omitted.

[About Setting Method of Comparison Voltage During Comparison Operation]

Figure 5:
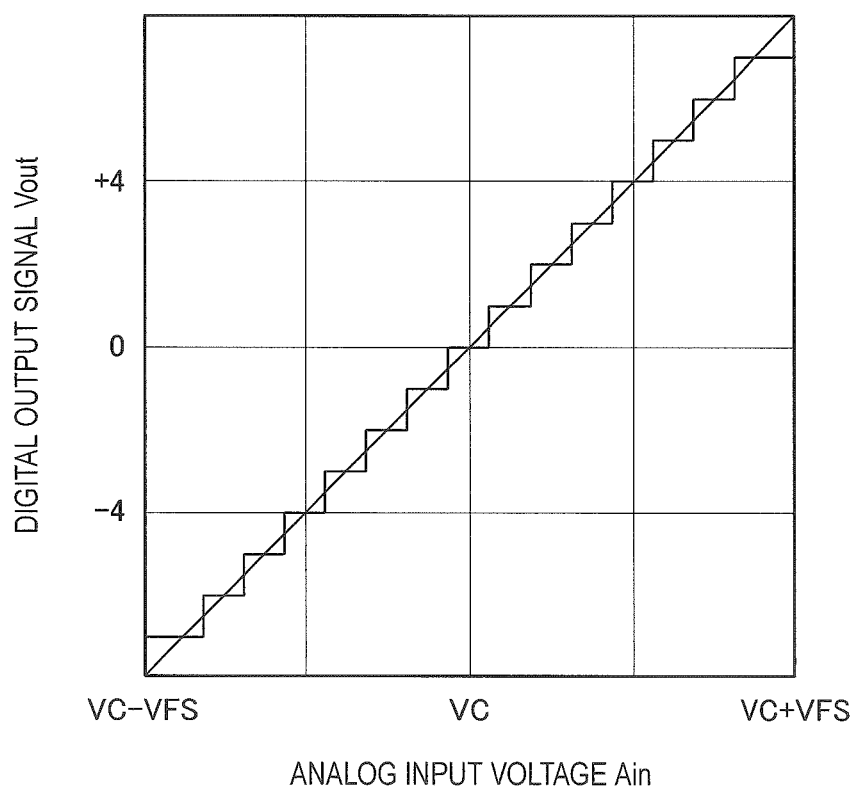
FIG. 5 is a diagram illustrating an example of a relationship between an analog input signal Ain and a digital output signal Vout of the successive-approximation type AD converter according to the first embodiment.

Herein, FIG. 5 is a diagram illustrating an example of a relationship between the analog input signal Ain and the digital output signal Vout of the successive-approximation type AD converter according to the first embodiment. In FIG. 5, the horizontal axis is a signal voltage (hereinafter, referred to as "analog input voltage") of the analog input signal Ain and the vertical axis is the digital output signal Vout.

As illustrated in FIG. 5, a setting method of a comparison voltage during comparison operation will be explained by using a case of constituting the successive-approximation type AD converter 1 with ±VFS as an input range around the first reference voltage VC.

In the first embodiment, to obtain the digital output signal Vout of (n+1) bits, each of the comparators 104 and 114 performs the n comparison operations. Hereinafter, a voltage output from the DA converter 109 is referred to as a "first comparison voltage", and a voltage output from the DA converter 119 is referred to as a "second comparison voltage".

In the first comparison, the control value DA0 is set so that the first comparison voltage is "VC+VFS/4", and the control value DA1 is set so that the second comparison voltage is "VC-VFS/4". For example, when "n=4", setting is performed to be "DA0=8" and "DA1=-8".

An interval between the first comparison voltage and the second comparison voltage at this time is "(VC+VFS/4)-(VC-VFS/4)=VFS/2".

Herein, the comparison result DO0_1 between the analog input signal Ain and the first comparison voltage and the comparison result DO1_1 between the analog input signal Ain and the second comparison voltage are illustrated as in the following Table 2 depending on the value of the analog input signal Ain. Moreover, a digital output code at this point is set to VO(1) and the definition is made as illustrated in the following Table 2 in accordance with the values of DO0_1 and DO1_1.

TABLE 2

| Value of Ain | DO0_1 | DO1_1 | VO (1) |
|---|---|---|---|
| Ain < (VC - VFS/4) | 0 | 0 | -1 |
| (VC - VFS/4) ≤ in < (VC + VFS/4) | 0 | 1 | 0 |
| Ain ≥ (VC + VFS/4) | 1 | 1 | 1 |

As illustrated in the above Table 2, in the case of "Ain<(VC-VFS/4)", both DO0_1 and DO1_1 are "0" and VO(1) at this time is defined as "-1". Moreover, in the case of "VC-VFS/4≤Ain<VC+VFS/4", DO0_1 is "0" and DO1_1 is "1", and VO(1) at this time is defined as "0". Moreover, in the case of "Ain≥(VC+VFS/4)", both DO0_1 and DO1_1 are "1" and VO(1) at this time is defined as "1".

Next, in the second comparison, an interval between the first and second comparison voltages is set to the half of the first interval to perform more detailed determination. Specifically, the first and second comparison voltages for the second time are set in accordance with the first comparison result as follows.

When the first comparison result is "Ain<(VC-VFS/4)", DA0 is set so that the first comparison voltage is "VC-VFS×⅜" and DA1 is set so that the second comparison voltage is "VC-VFS×⅝", in the second comparison. For example, in the case of "n=4", setting is performed to be "DA0=-12" and "DA1=-20".

When the first comparison result is "VC-VFS/4≤Ain<VC+VFS/4", DA0 is set so that the first comparison voltage is "VC+VFS/8" and DA1 is set so that the second comparison voltage is "VC-VFS/8", in the second comparison. For example, in the case of "n=4", setting is performed to be "DA0=4" and "DA1=-4".

Moreover, when the first comparison result is "Ain≥(VC+VFS/4)", DA0 is set so that the first comparison voltage is "VC+VFS×⅝" and DA1 is set so that the second comparison voltage is "VC+VFS×⅜", in the second comparison. For example, in the case of "n=4", setting is performed to be "DA0=20" and "DA1=12".

A digital output code obtained from the second comparison result is set to VO(2) and their values are defined as in the first comparison (see the above Table 2).

Hereinafter, similarly, an interval between DA0 and DA1 is set to the half of the previous time to perform more detailed determination. To obtain the AD conversion result of (n+1) bits, the comparison operation is repeatedly performed n times and VO(1) to VO(n) are obtained.

The final AD conversion result is obtained by the following Equation (6).

$$Vout = VO(1) \cdot (2^{n-1}) + VO(2) \cdot (2^{n-2}) + \ldots + VO(n) \quad (6)$$

Figure 6:
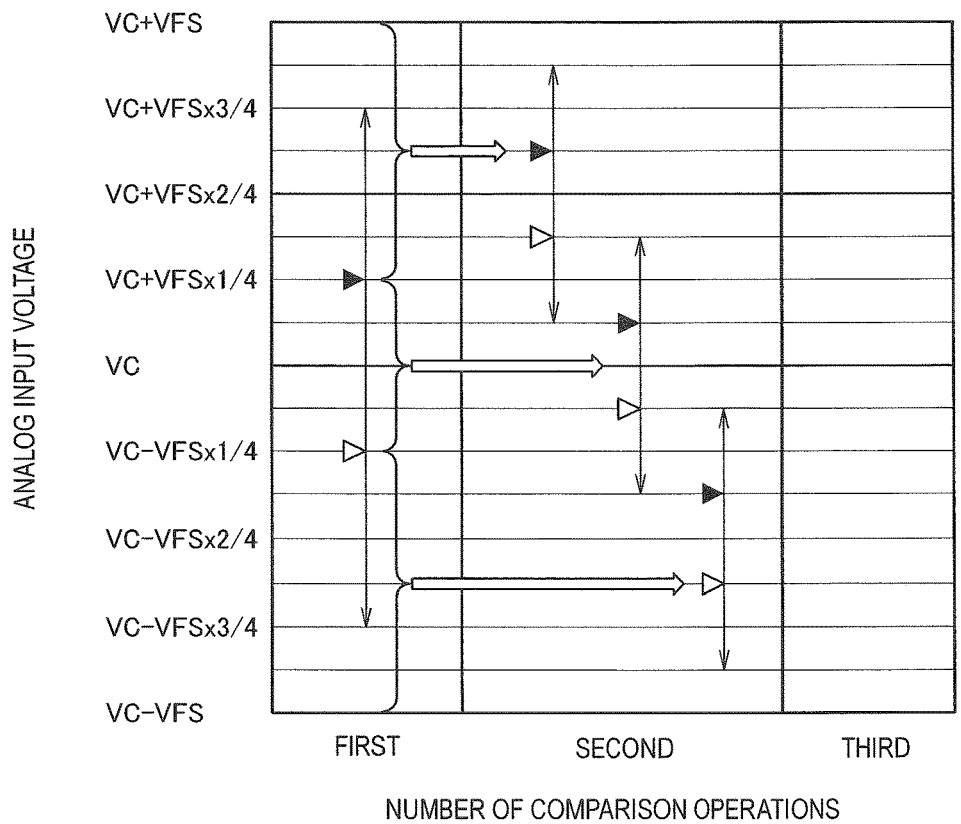
FIG. 6 is a diagram illustrating an example of a relationship between a comparison voltage and the number of comparison operations during comparison operation of the successive-approximation type AD converter according to the first embodiment.

The first and second operations among the above comparison operations are illustrated in FIG. 6. FIG. 6 is a diagram illustrating an example of a relationship between the comparison voltage and the number of comparison operations during comparison operation of the successive-approximation type AD converter according to the first embodiment. In FIG. 6, the position of the first comparison voltage is indicated by a black triangle mark and the position of the second comparison voltage is indicated by a white triangle mark. An interval between two triangle marks is the minimum resolution at the time of the comparison, and a vertical arrow line is written to have a width corresponding to the minimum resolution above and below the first and second comparison voltages. The range of the arrow line corresponds to an analog voltage range that can be determined at that point. Hereinafter, this voltage range is referred to as a "comparison range". Moreover, in this comparison range, a section between the maximum voltage and the first comparison voltage, a section between the first comparison voltage and the second comparison voltage, and a section between the second comparison voltage and the minimum voltage correspond to "determination sections" described in the claims. When taking the first comparison operation as an example, the comparison range has three determination sections of a section between the maximum voltage "VC+VFS×¾" and the first comparison voltage "VC+VFS×¼", a section between the first comparison voltage "VC+VFS×¼" and the second comparison voltage "VC-VFS×¼", and a section between the second comparison voltage "VC-VFS×¼" and the minimum voltage "VC-VFS×¾".

As illustrated in FIG. 6, compared to the first comparison operation, it can be seen that the comparison range is halved in the case of the second comparison operation. In addition, in FIG. 6, three comparison ranges are illustrated as the comparison range for the second comparison operation, but any one of the comparison ranges is actually set in accordance with the first comparison result.

[About Mechanism Responding to Changes in the Analog Input Signal Ain During Comparison Operation]

Figure 7:
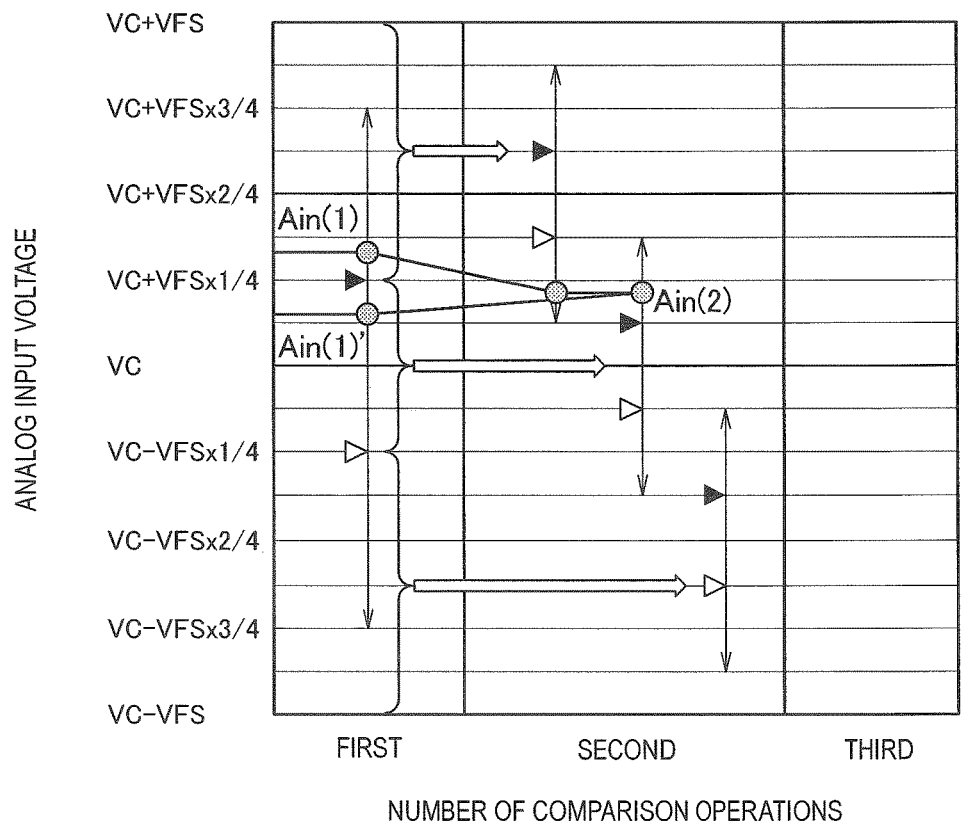
FIG. 7 is a diagram illustrating an example of a relationship between a comparison voltage and an analog input voltage when changing the analog input voltage of the successive-approximation type AD converter according to the first embodiment.

Herein, FIG. 7 is a diagram illustrating an example of a relationship between the comparison voltage and the analog input voltage when changing the analog input voltage of the successive-approximation type AD converter according to the first embodiment.

In the successive-approximation type AD converter 1 according to the first embodiment, when the analog input signal Ain is changed during the comparison operation, the AD conversion result may have errors because the subtraction voltages SN0 and SN1 are changed according to the change of the signal. On the contrary, in the first embodiment, the occurrence of errors in the AD conversion result is reduced by setting the first comparison voltage and the second comparison voltage by the setting method of the comparison voltage described above. Hereinafter, its mechanism will be explained.

Assuming that the analog input voltage at the first comparison is Ain(1) and the analog input voltage at the second comparison is Ain(2), digital output codes obtained by two comparisons are "VO(1)=1" for the first and "VO(2)=-1" for the second as illustrated in FIG. 7.

Herein, when the final output Vout is calculated in accordance with the above Equation (6) at the time of the second comparison, the final output is "Vout=1×2-1=1".

On the other hand, when the analog input voltage is changed from Ain(1)' at the first comparison to Ain(2) at the second comparison in FIG. 7, digital output codes obtained by two comparisons are "VO(1)=0" for the first and "VO(2)=1" for the second. In other words, this is different from the result when the first input voltage is Ain(1).

In this regard, however, also in this case, when the final output Vout is calculated in accordance with the above Equation (6) at the time of the second comparison, the final output is "Vout=0×2+1=1" and the same result as when the first input voltage is Ain(1) is obtained.

This indicates that, if the second input voltages are the same even if the analog input voltages in the first comparison are different, the AD conversion result as a whole has a result according to the input voltage at the second time.

In other words, in the present invention, as illustrated in FIG. 7, a comparison range is set so that the second comparison range when the analog input voltage is Ain(1) partly overlaps with the second comparison range when the analog input voltage is Ain(1)'. For that reason, when Ain(2) falls within this overlapping range, the final output Vout has the same result even if the first comparison results are different values. More specifically, a comparison range (range between the maximum voltage "VC+VFS×⅞" and the minimum voltage "VC+VFS×⅛") during the second determination set based on the determination result in the first determination section (section between the maximum voltage "VC+VFS×¾" and the first comparison voltage "VC+VFS×¼") among the first three determination sections, for example, is a voltage range that overlaps with a comparison range (range between the maximum voltage "VC+VFS×⅜" and the minimum voltage "VC-VFS×⅜") during the second determination set based on the determination result in the second determination section (section between the first comparison voltage and the second comparison voltage) adjacent to the first determination section, by at least part of the range (range between the voltage "VC+VFS×⅜" and the voltage "VC+VFS×⅛").

The successive-approximation type AD converter 1 according to the first embodiment is constituted by circuits configured to perform n comparisons to obtain the AD conversion result of (n+1) bits by using these characteristics. For that reason, the AD conversion result corresponding to the analog input voltage at the n-th comparison can be obtained in the n-th comparison operation, and thus it does not matter even if the analog voltages at the time of comparisons before that are slightly different.

On the other hand, as a contrast explanation, comparison operations when changing the analog input voltage in a successive-approximation type AD converter according to the related technology will be explained.

Figure 8:
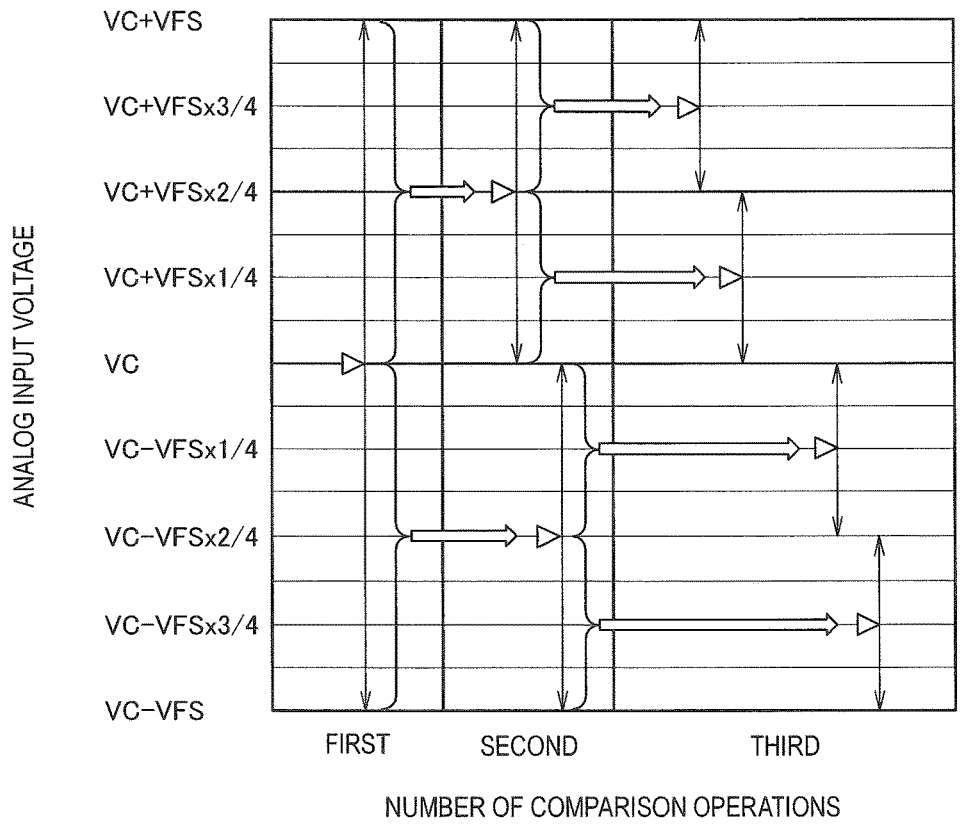
FIG. 8 is a diagram illustrating an example of a relationship between a comparison voltage and the number of comparison operations during comparison operation of a successive-approximation type AD converter according to the related technology.
Figure 9:
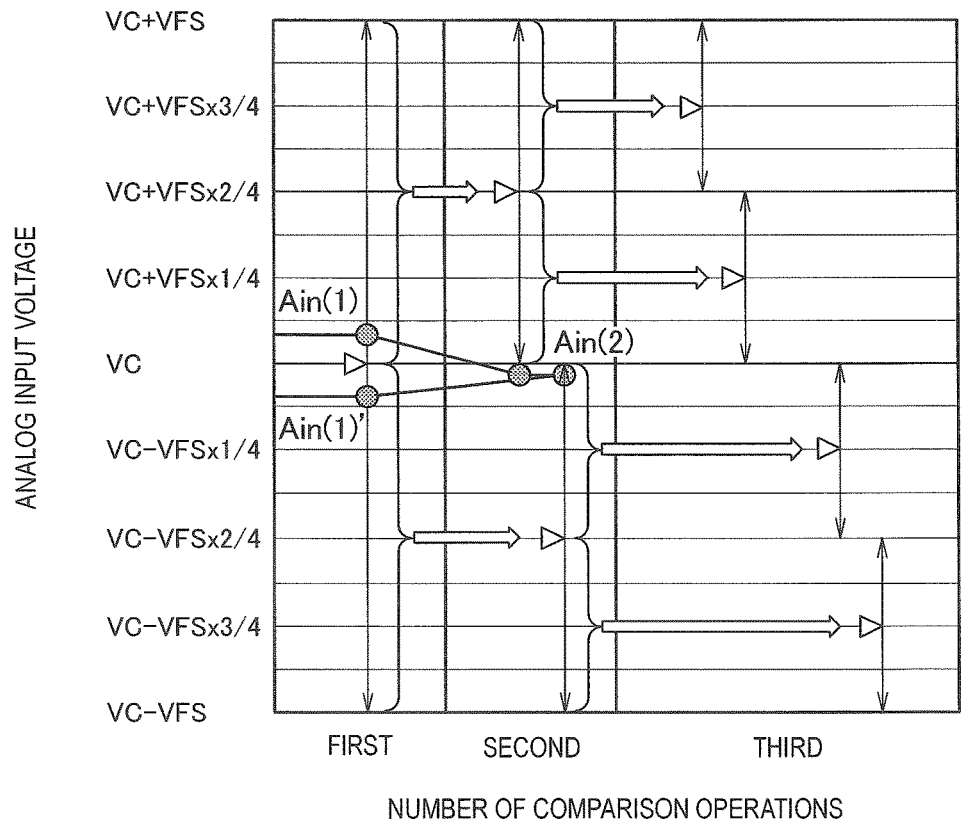
FIG. 9 is a diagram illustrating an example of a relationship between a comparison voltage and an analog input voltage when changing the analog input voltage of the successive-approximation type AD converter according to the related technology.

FIG. 8 is a diagram illustrating an example of a relationship between the comparison voltage and the number of comparison operations during comparison operation of the successive-approximation type AD converter according to the related technology. FIG. 9 is a diagram illustrating an example of a relationship between the comparison voltage and the analog input voltage when changing the analog input voltage of the successive-approximation type AD converter according to the related technology. In FIGS. 8 and 9, the position of the comparison voltage is indicated by a white triangle mark. Moreover, the comparison range is indicated by a vertical arrow line.

As illustrated in FIG. 8, the successive-approximation type AD converter according to the related technology has a configuration that there are not the overlapping range parts between comparison ranges used for the comparison operations after the second time.

For that reason, in the conventional comparison operations illustrated in FIG. 8, when the analog input signal is changed during the comparison operations, operations are as illustrated in FIG. 9.

In other words, when the analog input voltage is changed from Ain(1) at the first comparison to Ain(2) at the second comparison in FIG. 9, digital output codes obtained by two comparisons are "VO(1)=1" for the first and "VO(2)=0" for the second. Therefore, the final output Vout at the second time is "Vout=1×2+0=2".

On the other hand, when the first analog input voltage is changed from Ain(1)' to Ain(2) at the second comparison in FIG. 9, digital output codes obtained by two comparisons are "VO(1)=0" for the first and "VO(2)=1" for the second. Therefore, the final output Vout at the second time is "Vout=0×2+1=1".

In other words, when the analog input voltages at the first and second comparison operations are different, the final outputs Vout are also different and thus the AD converter cannot operate suitably. Therefore, the successive-approximation type AD converter according to the related technology once samples and holds the analog input voltage before entering the comparison operation and performs the comparison operation based on the held voltage. In other words, a delay for the comparison operation exists from the time of sampling to the output of the digital output signal via the comparison operation.

On the contrary, the successive-approximation type AD converter 1 according to the first embodiment can immediately output an AD conversion result corresponding to an analog input voltage at the final comparison while following the change in the analog input signal Ain. As a result, there is no conversion delay due to the sample hold as in the successive-approximation type AD converter according to the related technology.

Operation Example

Figure 10A:
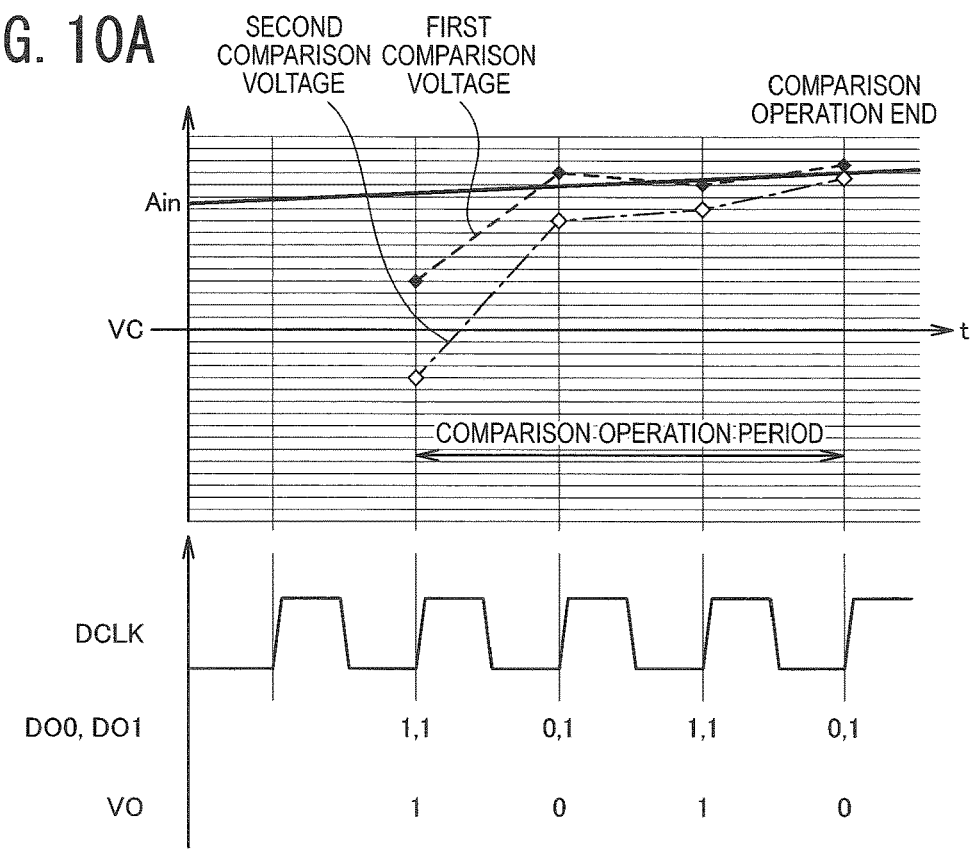
FIGS. 10A and 10B are diagrams illustrating an example of a time change in an analog input signal waveform, a comparison voltage, a clock signal waveform, a comparison result, and a digital output code during comparison operation of the successive-approximation type AD converter according to the first embodiment.

Next, an operation example of the successive-approximation type AD converter 1 according to the first embodiment will be explained based on FIG. 10A. FIG. 10A is a diagram illustrating an example of a time change in an analog input signal waveform, a comparison voltage, a clock signal waveform, a comparison result, and a digital output code during comparison operation of the successive-approximation type AD converter that can obtain 5-bit output according to the first embodiment.

Hereinafter, an operation for the successive-approximation type AD converter 1 of 5 bits will be explained on the assumption that "n=4". Herein, there will be explained operations after the switches 103a, 103c, 113a, and 113c are turned off and the switches 103b and 113b are turned on.

First, the control circuit 101 sets the control values DA0 and DA1 to "DA0=8" and "DA1=−8" so that the first and second comparison voltages are "VC+VFS/4" and "VC−VFS/4" (see FIG. 3). Then, the control circuit 101 supplies the control signal CTRL based on the control values DA0 and DA1 to the DA converters 109 and 119. In this case, the control values for the DA converter 109 are "0" for "NEG, D1, D3, D4, and D5" and "1" for "D2". The control values for the DA converter 119 are "1" for "NEG and D2" and "0" for "D1, D3, D4, and D5".

Therefore, in the DA converter 109, the switches 103d_1, 103d_3, 103d_4, 103d_5, and 103f_2 are turned on. In the DA converter 119, the switches 113d_1, 113d_3, 113d_4, 113d_5, and 113e_2 are turned on.

As a result, the storage node SN0 holds the subtraction voltage SN0 obtained by subtracting the first comparison voltage "VC+VFS/4" by the DA converter 109 from the analog input voltage Ain, and the storage node SN1 holds the subtraction voltage SN1 obtained by subtracting the second comparison voltage "VC−VFS/4" by the DA converter 119 from the analog input voltage Ain.

Then, in accordance with the rising edge of the clock signal DCLK, the subtraction voltage SN0 of the storage node SN0 and the reference voltage VC are compared and determined by the comparator 104. At the same time, in accordance with the rising edge of the clock signal DCLK, the subtraction voltage SN1 of the storage node SN1 and the reference voltage VC are compared and determined by the comparator 114.

As illustrated in FIG. 10A, because both the first comparison voltage and the second comparison voltage are smaller than the analog input voltage Ain, the comparison results "DO0_1=1" and "DO1_1=1" are respectively output to the control circuit 101 and the output register 102 (see the above Table 2).

As a result, in the output register 102, "1" is set as the digital output code VO(1) from the comparison results of "DO0_1=1" and "DO1_1=1" (see the above Table 2).

Moreover, from the comparison results of "DO0_1=1" and "DO1_1=1", the control circuit 101 sets the control value DA0 so that the first comparison voltage is "VC+VFS×⅝" and sets the control value DA1 so that the second comparison voltage is "VC+VFS×⅜". Specifically, the control circuit 101 sets the control values DA0 and DA1 to "DA0=20" and "DA1=12" (see FIG. 3). Then, the control circuit 101 supplies the control signal CTRL based on the control values DA0 and DA1 to the DA converters 109 and 119. In this case, the control values for the DA converter 109 are "0" for "NEG, D2, D4, and D5" and "1" for "D1 and D3". The control values for the DA converter 119 are "0" for "NEG, D1, D4, and D5" and "1" for "D2 and D3".

Therefore, in the DA converter 109, the switches 103d_2, 103d_4, 103d_5, 103f_1, and 103f_3 are turned on. In the DA converter 119, the switches 113d_1, 113d_4, 113d_5, 113e_2, and 113e_3 are turned on.

As a result, the storage node SN0 holds the subtraction voltage SN0 obtained by subtracting the first comparison voltage "VC+VFS×⅝" by the DA converter 109 from the analog input voltage Ain. The storage node SN1 holds the subtraction voltage SN1 obtained by subtracting the second comparison voltage "VC+VFS×⅜" by the DA converter 119 from the analog input voltage Ain.

Then, in accordance with the rising edge of the clock signal DCLK, the subtraction voltage SN0 and the reference voltage VC are compared and determined by the comparator 104, and the subtraction voltage SN1 and the reference voltage VC are compared and determined by the comparator 114. As illustrated in FIG. 10A, because the analog input voltage Ain is smaller than the first comparison voltage and is larger than the second comparison voltage, the comparison results "DO0 2=0" and "DO1_2=1" are respectively output to the control circuit 101 and the output register 102.

As a result, in the output register 102, "0" is set as the digital output code VO(2) from the comparison results of "DO0_2=0" and "DO1_2=1".

Hereinafter, similarly to the above, the control values DA0 and DA1 are set based on the just previous comparison results so that an interval between the first comparison voltage and the second comparison voltage becomes the half of the previous time, then a comparison determination process is performed.

As illustrated in FIG. 10A, in the third comparison determination, "DO0_3=1" and "DO1_3=1" are obtained and "1" is set as the digital output code VO(3) in the output register 102. Finally, in the fourth comparison determination, "DO0_4=0" and "DO1_4=1" are obtained.

Then, from the digital output codes VO(1) to VO(4), the output register 102 computes "Vout=1×2³+0×2²+1×2¹+ 0=10" as the final output Vout in accordance with the above Equation (6).

The final output Vout is the AD conversion result of the analog input signal Ain at the time of the final comparison.

Figure 10B:
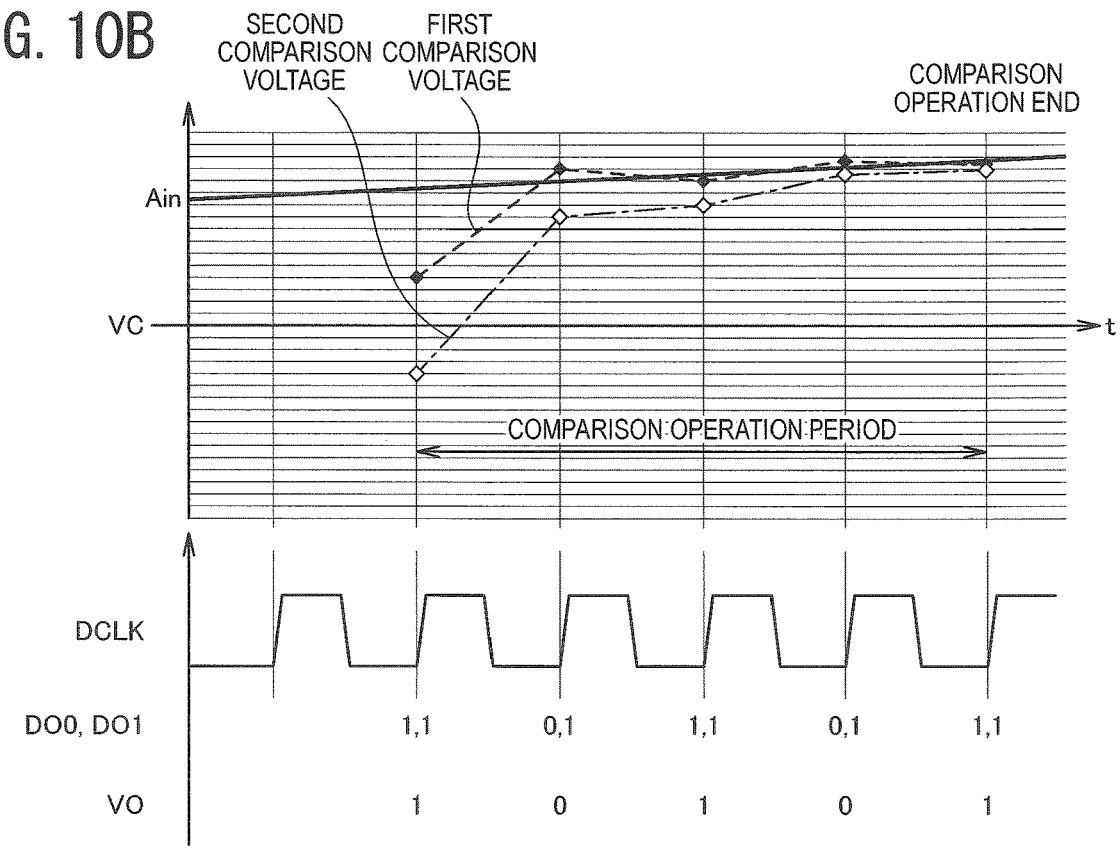

On the other hand, FIG. 10B is a diagram illustrating an example of a time change in an analog input signal waveform, a comparison voltage, a clock signal waveform, a comparison result, and a digital output code during comparison operation of the successive-approximation type AD converter that can obtain 6-bit output according to the first embodiment.

The content illustrated in FIG. 10B is adapted to the successive-approximation type AD converter having 6-bit output illustrated in FIG. 21 according to the related technology. Basic operation contents are the same as those of the successive-approximation type AD converter 1 of 5 bits described above.

In the successive-approximation type AD converter 1 having 6-bit output according to the first embodiment, as illustrated in FIG. 10B, "DO0_1=DO1_1=1" and "VO(1)=1" are obtained in the first comparison determination, and "DO0_2=0", "DO1_2=1", and "VO(2)=0" are obtained in the second comparison determination. Additionally, "DO0_3=DO1_3=1" and "VO(3)=1" are obtained in the third comparison determination, and "DO0_4=0", "DO1_4=1", and "VO(4)=0" are obtained in the fourth comparison determination. Then, "DO0_5=1", "DO1_5=1", and "VO(5)=1" are obtained in the final fifth comparison determination.

As a result, "Vout=1×2⁴+0×2³+1×2²+0×2¹+1=21" is obtained as the final output Vout in accordance with the above Equation (6).

On the other hand, in the successive-approximation type AD converter of 6 bits illustrated in FIG. 21 according to the related technology, "D1=1", "D2=1", "D3=0", "D4=1", "D5=0", and "D6=1" are obtained as the comparison results by six comparison operations. In other words, "010101" is obtained in binary notation. In addition, only the most significant bit (D1) is inverted from "1" to "0" for two's complement representation.

Therefore, "Vout=0×2⁵+1×2⁴+0×2³+1×2²+0×2¹+1=21" is obtained as the final output Vout.

In the example illustrated in FIG. 10B, because the analog input voltage Ain at the time of the final comparison becomes equal to the analog input voltage Ain at the time of sampling of the conventional configuration illustrated in FIG. 21, both the final outputs are identical to each other.

[Actions and Effects of First Embodiment]

In the successive-approximation type AD converter 1 according to the first embodiment, the receiving circuits 107 and 117 receive the analog input signal Ain and output the analog input signal AinO according to the analog input signal Ain. The subtractors 108a and 118a calculate the subtraction signals (the subtraction voltages SN0 and SN1) between the analog input signal AinO for each of n successive conversions and the analog comparison signals (the first and second comparison voltages) obtained by DA-converting the control values DA0 and DA1. The comparators 104 and 114 determine whether the subtraction voltages SN0 and SN1 are higher than the reference voltage VC. Based on the comparison results DO0 and DO1 of the comparators 104 and 114, the control circuit 101 computes the digital output signal Vout corresponding to the analog input signal AinO. Furthermore, based on the comparison results DO0 and DO1 for each time of the comparators 104 and 114, the control circuit 101 updates the control values DA0 and DA1 so that the analog comparison signals (the first and second comparison voltages) approach the analog input signal AinO. The DA converters 109 and 119 convert the control values DA0 and DA1 into the analog comparison signals (the first and second comparison voltages). Based on the comparison results DO0 and DO1 of the comparators 104 and 114, the output register 102 outputs the digital output signal.

In other words, the successive-approximation type AD converter 1 includes the first to m-th (m=2 in the present embodiment) receiving circuits 107 and 117, the first to m-th (m=2 in the present embodiment) comparators 104 and 114, the first to m-th (m=2 in the present embodiment) DA converters 109 and 119, and the first to m-th (m=2 in the present embodiment) subtractors 108a and 118a. Based on the comparison results DO0 and DO1 at the successive conversion timing of the comparators 104 and 114, the control circuit 101 updates the control values DA0 and DA1 respectively corresponding to the DA converters 109 and 119. Based on the comparison results DO0 and DO1 of the comparators 104 and 114, the output register 102 computes the digital output signal Vout.

Furthermore, the successive-approximation type AD converter 1 according to the first embodiment includes the switch 103c into which the analog input signal Ain is input. Additionally, the successive-approximation type AD converter 1 includes the first reference voltage terminal VC having the first reference voltage VC, the second reference voltage terminal VRP having the positive second reference voltage VRP by using the first reference voltage VC as a reference, and the third reference voltage terminal VRN having the negative third reference voltage VRN by using the first reference voltage VC as a reference. Additionally, the receiving circuit 107 has a capacitor whose electrostatic capacity is Cin.

Furthermore, in the successive-approximation type AD converter 1 according to the first embodiment, the DA converter 109 has: the capacitors 106_1 to 106_(n+1) whose one ends are connected to the storage node SN0; and the switch groups 105_1 to 105_(n+1) configured to connect the other ends of the capacitors 106_1 to 106_(n+1) to the first reference voltage terminal VC, the second reference voltage terminal VRP, or the third reference voltage terminal VRN in accordance with the digital signal of the control value DA0. Moreover, the DA converter 119 has: the capacitors 116_1 to 116_(n+1) whose one ends are connected to the storage node SN1; and the switch groups 115_1 to 115_(n+1) configured to connect the other ends of the capacitors 116_1 to 116_(n+1) to the first reference voltage terminal VC, the second reference voltage terminal VRP, or the third reference voltage terminal VRN in accordance with the digital signal of the control value DA1. Moreover, the first embodiment has the configuration that the capacitance value of the capacitors 106_K and 116_K (K is a natural number of 1≤K≤(n+1)) among the capacitors 106_1 to 106_(n+1) and 116_1 to 116_(n+1) has a value obtained by multiplying the capacitance value of the capacitors 106_(n+1) and 116_(n+1) by the ((n+1)−k) power 2.

With this configuration, when the receiving circuits 107 and 117 receive the analog input signal Ain, the analog input signal AinO according to the received analog input signal Ain can be output to the storage nodes SN0 and SN1. In other words, without sampling and holding an input signal, a signal according to the input signal is output to the storage nodes SN0 and SN1 without change. This makes it possible to perform a comparison process on the analog input signal AinO that changes in real time by the comparators 104 and 114. As a result, delay due to sample hold can be removed compared to the conventional, and thus a conversion rate can be improved.

In the successive-approximation type AD converter 1 according to the first embodiment, based on the comparison results DO0 and DO1 of the DA converters 109 and 119, the control circuit 101 further sets a comparison range having the plurality of determination sections when the analog input signal AinO is determined. The control circuit 101 updates the control values DA0 and DA1 respectively corresponding to the DA converters 109 and 119 so that a comparison range at the (j+1)th determination set based on the comparison results DO0_j and DO1_j in the first determination section among the j-th plurality of determination sections (j is a natural number of 1n, the same applies hereinafter) of the comparators 104 and 114 overlaps with a comparison range at the (j+1)th determination set based on the comparison results DO0 and DO1 in the second determination section adjacent to the first determination section that is one determination section among the j-th plurality of determination sections, by at least part of the range.

Specifically, the control circuit 101 updates the control values DA0 and DA1 respectively corresponding to the DA converters 109 and 119 so that the width of the comparison range at the (j+1)th determination is the half of the width of the comparison range at the j-th determination.

With this configuration, the comparison range can be set so that the comparison range of the analog input signal AinO of the comparators 104 and 114 at the j-th comparison operation partly overlaps with the comparison range of the analog input signal AinO at the (j+1)th comparison determination operation. When the analog input signal AinO at the (j+1)th comparison operation falls within this overlapping range, this makes it possible to have the same result for the final output Vout even if the comparison results before the j-th time are slightly different values. As a result, the occurrence of errors can be reduced in the AD conversion result when the analog input voltage AinO is changed.

Second Embodiment

Next, the second embodiment of the present invention will be explained based on FIGS. 11 and 12.

Figure 11:
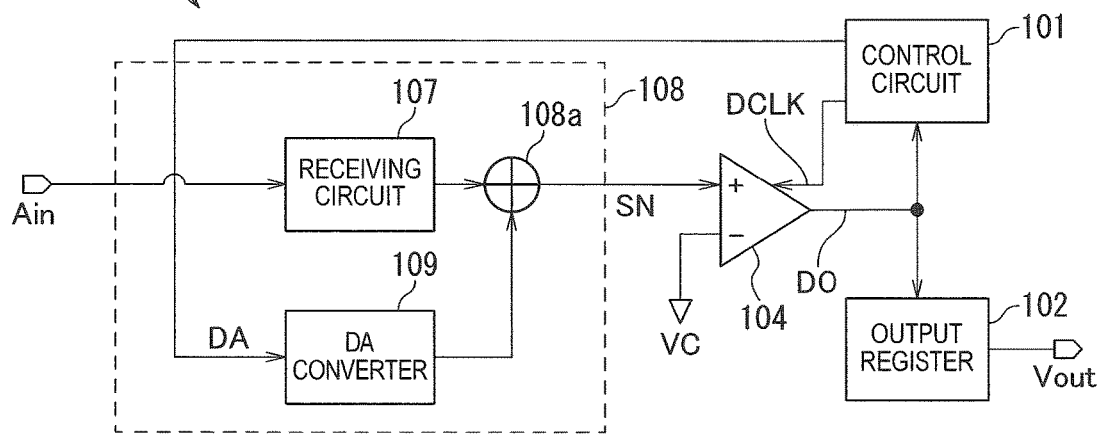
FIG. 11 is a diagram illustrating a basic configuration of a successive-approximation type AD converter having a single-ended configuration according to the second embodiment.

FIG. 11 is a diagram illustrating a basic configuration of a successive-approximation type AD converter having a single-ended configuration according to the second embodiment. FIG. 12 is a diagram illustrating a specific configuration of the successive-approximation type AD converter having the single-ended configuration according to the second embodiment.

[Configuration]

The first embodiment has the configuration that two sets of which each includes a comparison switched capacitor circuit and a comparator are prepared and the comparison operations are concurrently performed with the two sets. Unlike the first embodiment, the second embodiment has a configuration that one set of a comparison switched capacitor circuit and a comparator is prepared and the comparison operations concurrently performed in the first embodiment are performed in a time-division manner by using the one set.

Hereinafter, the same component parts as those of the first embodiment have the same reference numbers, and their descriptions are appropriately omitted and the different points will be described in detail.

Figure 12:
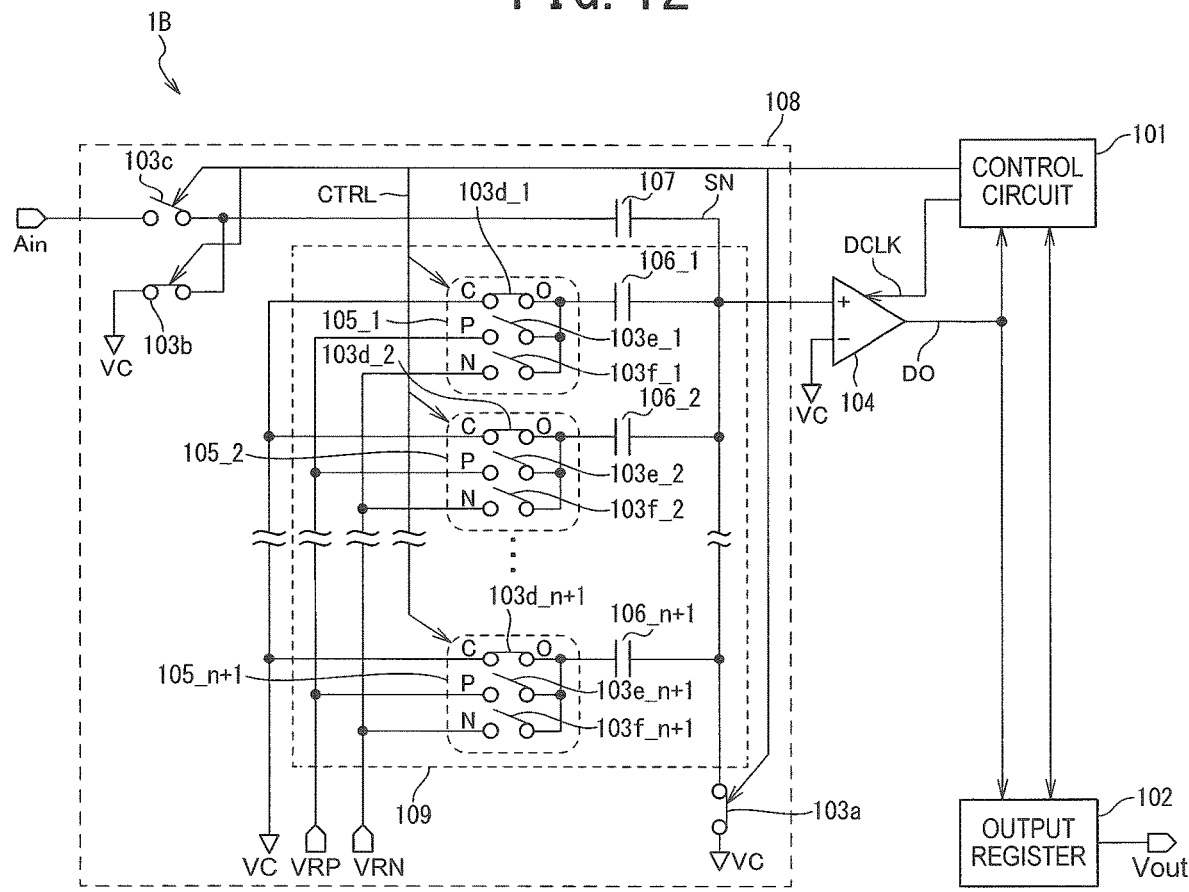
FIG. 12 is a diagram illustrating a specific configuration of the successive-approximation type AD converter having the single-ended configuration according to the second embodiment.

As illustrated in FIGS. 11 and 12, a successive-approximation type AD converter 1B according to the second embodiment has a configuration that the comparison switched capacitor circuit 118 and the comparator 114 are excluded from the successive-approximation type AD converter 1 according to the first embodiment.

The control circuit 101 according to the second embodiment first computes the control value DA0 and supplies the control signal CTRL based on the computed control value DA0 to the comparison switched capacitor circuit 108. As a result, the DA converter 109 generates a first comparison voltage made by DA-converting the control value DA0 and outputs the generated first comparison voltage to a storage node SN. Herein, the computation (setting) method of the control value DA0 is the same as the first embodiment.

The comparator 104 according to the second embodiment compares the reference voltage VC with a subtraction voltage SN (corresponding to the subtraction voltage SN0 of the first embodiment) between the analog input voltage Ain output from the receiving circuit 107 to the storage node SN and the first comparison voltage output from the DA converter 109 to the storage node SN. Then, the comparator 104 outputs a comparison result DO (corresponding to DO0 of the first embodiment) to the control circuit 101 and the output register 102.

The control circuit 101 and the output register 102 of the second embodiment hold the comparison result DO input from the comparator 104. Hereinafter, the first comparison result in each comparison operation is referred to as "DO0".

Subsequently, the control circuit 101 computes the control value DA1 and supplies the control signal CTRL based on the computed control value DA1 to the comparison switched capacitor circuit 108. As a result, the DA converter 109 generates a second comparison voltage made by DA-converting the control value DA1 and outputs the generated second comparison voltage to the storage node SN. Herein, the computation (setting) method of the control value DA1 is the same as the first embodiment.

The comparator 104 compares the reference voltage VC with a subtraction voltage SN (corresponding to the subtraction voltage SN1 of the first embodiment) between the analog input voltage Ain output from the receiving circuit 107 to the storage node SN and the second comparison voltage output from the DA converter 109 to the storage node SN. Then, the comparator 104 outputs a comparison result DO (corresponding to DO1 of the first embodiment) to the control circuit 101 and the output register 102. Hereinafter, the second comparison result DO in each comparison operation is referred to as "DO1".

Based on the comparison results DO0 and DO1 sequentially input from the comparator 104, the control circuit 101 according to the second embodiment updates the control values DA0 and DA1 in the same manner as in the first embodiment. Moreover, based on the comparison results DO0 and DO1 input from the comparator 104, the output register 102 according to the second embodiment computes a digital output code VO in the same manner as in the first embodiment.

[Actions and Effects of Second Embodiment]

The successive-approximation type AD converter 1B according to the second embodiment has the configuration that the comparison switched capacitor circuit 118 and the comparator 114 are excluded from the successive-approximation type AD converter 1 of the first embodiment. Moreover, one set of the comparison switched capacitor circuit 108 and the comparator 104 performs the comparison operations concurrently performed in the first embodiment are divided by two times and are performed in a time-division manner.

With this configuration, the conversion operation becomes longer compared to the first embodiment, but while suppressing conversion errors, conversion delay due to the sample hold can be removed and a conversion rate can be improved compared to the conventional. Moreover, a circuit scale can be reduced compared to the successive-approximation type AD converter 1 of the first embodiment.

Third Embodiment

Next, the third embodiment of the present invention will be explained based on FIG. 13.

Figure 13:
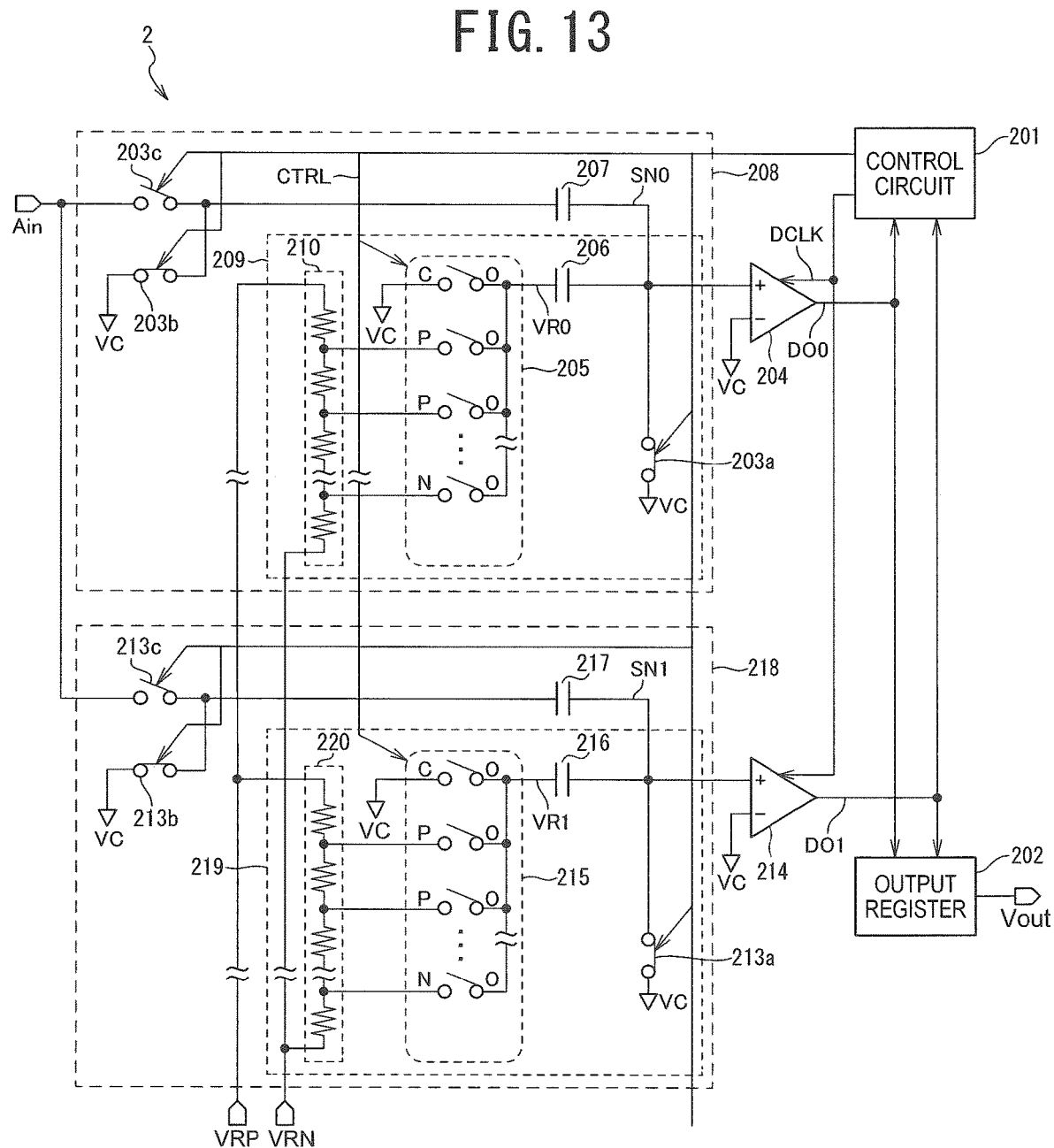
FIG. 13 is a diagram illustrating a specific configuration of a successive-approximation type AD converter according to the third embodiment.

FIG. 13 is a diagram illustrating a specific configuration of a successive-approximation type AD converter according to the third embodiment.

[Configuration]

The first embodiment has the configuration that the DA converters 109 and 119 generate the comparison voltages by using the plurality of capacitors. The third embodiment is different from the first embodiment in that the DA converters generate the comparison voltages by using a plurality of resistors (resistance ladders) instead of the plurality of capacitors.

Hereinafter, the same component parts as those of the first embodiment have the same reference numbers, and their descriptions are appropriately omitted and the different points will be described in detail.

As illustrated in FIG. 13, a successive-approximation type AD converter 2 according to the third embodiment includes a control circuit 201, an output register 202, comparators 204 and 214, and comparison resistance-ladder type DA converter circuits 208 and 218.

The comparison resistance-ladder type DA converter circuit 208 includes switches 203*a*, 203*b*, and 203*c*, a receiving circuit 207, a storage node SN0, and a DA converter 209. Herein, the switch 203*c* corresponds to a first switch circuit described in the claims.

Similar to the receiving circuit 107 of the first embodiment, the receiving circuit 207 has a capacitor whose electrostatic capacity is set to the capacitance value Cin.

The DA converter 209 includes a switch group 205 having a plurality of switches, a capacitor 206, and a resistance ladder 210 having a plurality of resistance elements connected in series. Herein, the switch group 205 corresponds to a second switch circuit described in the claims, and the capacitor 206 corresponds to a second capacitive element described in the claims.

The capacitor 206 is a capacitor whose electrostatic capacity is set to the capacitance value C, and its right end is connected to a connection point between the storage node SN0, the right end of the receiving circuit 207, and the upper end of the switch 203*a*.

The switch group 205 includes the plurality of switches. As illustrated in FIG. 13, among the plurality of switches, the left end of the uppermost switch is connected to the first reference voltage terminal VC. Moreover, the left end of each of the remaining switches is connected to a corresponding one among a plurality of terminals (hereinafter, referred to as "resistance connection terminals") formed at connections between the elements of the plurality of resistance elements constituting the resistance ladder 210. The right ends of the plurality of switches of the switch group 205 are connected to the right ends of the other switches and the left end of the capacitor 206.

Among the plurality of resistance elements of the resistance ladder 210 connected in series, the upper end of the uppermost resistance element in FIG. 13 is connected to the second reference voltage terminal VRP and the lower end of the lowermost resistance element in FIG. 13 is connected to the third reference voltage terminal VRN.

In the third embodiment, the plurality of resistance elements of the resistance ladder 210 are constituted by elements having the same resistance value R, and the plurality of switches of the switches 203*a* to 203*c* and the switch group 205 are constituted by switching elements such as MOS transistors.

Moreover, the plurality of switches of the switch group 205 includes a common terminal O to which the right ends of the switches are connected. A terminal C is formed at the left end of the uppermost switch. Moreover, terminals P are formed at the left ends of the switches corresponding to electric potentials from the second from the top to the first reference voltage VC, and terminals N are formed at the left ends of the switches corresponding to electric potentials up to the subsequent third reference voltage VRN.

The plurality of switches of the switch group 205 switches between the On/Off states in accordance with the control signal CTRL from the control circuit 201 and short-circuits any one or more of "the terminal C and the terminal O", "the terminal P and the terminal O", and "the terminal N and the terminal O". As a result, the left end of the capacitor 206 is connected to the first reference voltage terminal VC, or is connected to any of the resistance connection terminals connected to the terminals P or any of the resistance connection terminals connected to the terminals N.

The storage node SN0 is a node capable of storing electric charge, which is formed at a connection point between the right end of the capacitor 206, the noninverting input terminal of the comparator 204, the upper end of the switch 203*a*, and the right end of the capacitor (hereinafter, also referred to as "the capacitor 207") constituting the receiving circuit 207.

When the switches 203*a* and 203*b* are turned off and the switch 203*c* is turned on by the connection configuration of the various capacitors 206 and 207 and the various switches described above, a function equivalent to the subtractor 108*a* of the first embodiment is exerted. In other words, in this connection state, the storage node SN0 holds the subtraction voltage SN0 that is a voltage obtained by adding or subtracting the holding voltage (the output voltage of the DA converter 209) of the capacitor 206 to or from the holding voltage (the voltage of the analog input signal Ain) of the capacitor 207 in accordance with the polarity.

The switch 203*a* is constituted by a switching element such as a MOS transistor, and its upper end is connected to the storage node SN0 and its lower end is connected to the first reference voltage terminal VC. Herein, the switch 203*a* switches between the On/Off states in accordance with the control signal CTRL from the control circuit 201 to connect the storage node SN0 to the first reference voltage terminal VC in the On state.

The switch 203*b* is constituted by a switching element such as a MOS transistor, and its right end is connected to the right end of the switch 203*c* and the left end of the receiving circuit 207 and its left end is connected to the first reference voltage terminal VC. Herein, the switch 203*b* switches between the On/Off states in accordance with the control signal CTRL from the control circuit 201 to connect the left end of the receiving circuit 207 to the first reference voltage terminal VC in the On state.

The switch 203*c* is constituted by a switching element such as a MOS transistor, and its right end is connected to the right end of the switch 203*b* and the left end of the receiving circuit 207 and its left end is connected to the signal input terminal Ain of the analog input signal Ain. Herein, the switch 203c switches between the On/Off in accordance with the control signal CTRL from the control circuit 201 to connect the left end of the receiving circuit 207 to the signal input terminal Ain in the On state.

In addition, the switching operations of the switch 203b and the switch 203c are non-overlappingly controlled not to be simultaneously in the On state.

With the configuration described above, the DA converter 209 divides the full-scale voltage by the resistance ladder 210 to control the on and off of the various switches and takes out a desired divided voltage from each resistance connection terminal to the capacitor 206 to generate the first comparison voltage.

On the other hand, the comparison resistance-ladder type DA converter circuit 218 includes switches 213a to 213c, a receiving circuit 217, a storage node SN1, and a DA converter 219.

The receiving circuit 217 is constituted by a capacitor having the same electrostatic capacity Cin as the receiving circuit 207. With such a configuration, the receiving circuit 217 has a role to supply (add) the analog input signal Ain input into the signal input terminal Ain to the storage node SN1 that is the input node of the comparator 214.

The DA converter 219 includes a switch group 215, a capacitor 216, and a resistance ladder 220. Herein, the switch group 215 corresponds to a second switch circuit described in the claims, and the capacitor 216 corresponds to a second capacitive element described in the claims.

The capacitor 216 has the same configuration as the capacitor 206 except a part of the connection configuration, the switch group 215 has the same configuration as the switch group 205 except a part of the connection configuration, and the resistance ladder 220 has the same configuration as the resistance ladder 210.

The common terminal O of the plurality of switches of the switch group 215 is connected to the left end of the capacitor 216, and the terminal C of the uppermost switch is connected to the first reference voltage terminal VC. Moreover, the terminal P of each of the second and subsequent switches from the top is connected to any one of the resistance connection terminals corresponding to electric potentials from an electric potential of the uppermost resistance connection terminal connected to the resistance ladder 220 to the first reference voltage VC. Moreover, the terminal N of each of the switches located below the switches connected to the terminals P is connected to any one of the resistance connection terminals corresponding to electric potentials up to the negative third reference voltage VRN by using the first reference voltage VC as a reference.

Then, the plurality of switches of the switch group 215 switches between the On/Off states in accordance with the control signal CTRL from the control circuit 201 and short-circuits any one of "the terminal C and the terminal O", "the terminal P and the terminal O", and "the terminal N and the terminal O". As a result, the left end of the capacitor 216 is connected to the first reference voltage terminal VC, or is connected to any of the resistance connection terminals connected to the terminals P or any of the resistance connection terminals connected to the terminals N.

The storage node SN1 is a node capable of storing electric charge, which is formed at a connection point of the right end of the capacitor 216, the noninverting input terminal of the comparator 214, the upper end of the switch 213a, and the right end of the capacitor (hereinafter, also referred to as "the capacitor 217") constituting the receiving circuit 217.

When the switches 213a and 213b are turned off and the switch 213c is turned on by the connection configuration of the various capacitors 216 and 217 and the various switches described above, a function equivalent to the subtractor 218a of the first embodiment is exerted. In other words, in this connection state, the storage node SN1 holds the subtraction voltage SN1 that is a voltage obtained by adding or subtracting the holding voltage (the output voltage of the DA converter 219) of the capacitor 216 to or from the holding voltage (the voltage of the analog input signal Ain) of the capacitor 217 in accordance with the polarity.

The switch 213a is constituted by a switching element such as a MOS transistor, and its upper end is connected to the storage node SN1 and its lower end is connected to the first reference voltage terminal VC. Herein, the switch 213a switches between the On/Off states in accordance with the control signal CTRL from the control circuit 201 to connect the storage node SN1 to the first reference voltage terminal VC in the On state.

The switch 213b is constituted by a switching element such as a MOS transistor, and its right end is connected to the right end of the switch 213c and the left end of the receiving circuit 217 and its left end is connected to the first reference voltage terminal VC. Herein, the switch 213b switches between the On/Off states in accordance with the control signal CTRL from the control circuit 201 to connect the left end of the receiving circuit 217 to the first reference voltage terminal VC in the On state.

The switch 213c is constituted by a switching element such as a MOS transistor, and its right end is connected to the right end of the switch 213b and the left end of the receiving circuit 217 and its left end is connected to the signal input terminal Ain of the analog input signal Ain. Herein, the switch 213c switches between the On/Off states in accordance with the control signal CTRL from the control circuit 201 to connect the left end of the receiving circuit 217 to the signal input terminal Ain in the On state.

In addition, the switch 213b and the switch 213c are non-overlappingly controlled.

With the configuration described above, the DA converter 219 divides the full-scale voltage by the resistance ladder 220 to control the on and off of the various switches and takes out a desired divided voltage from each resistance connection terminal to the capacitor 216 to generate the second comparison voltage.

Based on the comparison results DO0 and DO1 of the comparators 204 and 214, the control circuit 201 has a function of generating the control signal CTRL for controlling switching operations between the switches 203a to 203c and 213a to 213c and the switches of the switch groups 205 and 215.

The output register 202 has a function of holding the signal values (DO0_1 to DO0_$n$ and DO1_1 to DO1_$n$) indicating the comparison results output from the comparators 204 and 214. Additionally, based on the held comparison results DO0_1 to DO0_$n$ and DO1_1 to DO1_$n$, the output register has a function of generating the digital output signal Vout of (n+1) bits and outputting the generated digital output signal Vout.

In accordance with the rising edge of the clock signal DCLK from the control circuit 201, the comparator 204 compares the subtraction voltage SN0 input into the noninverting input terminal with the reference voltage VC input into the inverting input terminal. Then, the comparator 204 outputs a high-level signal ("DO0_M=1") as the comparison result DO0_M when "SN0≥VC". Moreover, the comparator 204 outputs a low-level signal ("DO0_M=0") as the comparison result DO0_M when "SN0<VC".

In accordance with the rising edge of the clock signal DCLK from the control circuit 201, the comparator 214 compares the subtraction voltage SN1 input into the noninverting input terminal with the reference voltage VC input into the inverting input terminal. Then, the comparator outputs a high-level signal ("DO1_M=1") as the comparison result DO1_M when "SN1≥VC". Moreover, the comparator outputs a low-level signal ("DO1_M=0") as the comparison result DO1_M when "SN1<VC".

[About the Subtraction Voltage SN0 of the Storage Node SN0]

Herein, the switches 203a and 203b are turned off and the switch 203c is turned on to transmit the analog input signal Ain to the noninverting input terminal of the comparator 204.

The subtraction voltage SN0 at this time is changed depending on the On/Off states of each switch of the switch group 205. Moreover, the subtraction voltage SN0 can be represented by the following Equation (7) when the impact of parasitic capacitance is ignored.

$$SN0 = (Cin/(Cin+C)) \cdot Ain + (Cin/(Cin+C)) \cdot (VR0-VC) + VC \quad (7)$$

In the above Equation (7), VR0 is a voltage of the terminal O of any switch among the plurality of switches of the switch group 205 selected by the control value DA0. Moreover, Cin is the electrostatic capacity value of the capacitor 207 and C is the electrostatic capacity value of the capacitor 206.

Because the second term of the above Equation (7) is determined by the control value DA0, the above Equation (7) is equivalent to Equation (4) of the first embodiment. In addition, the subtraction voltage SN1 is the same as in SN0.

Therefore, the successive-approximation type AD converter 2 according to the third embodiment can perform the same operations as those of the successive-approximation type AD converter 1 according to the first embodiment.

[Actions and Effects of Third Embodiment]

In the successive-approximation type AD converter 2 according to the third embodiment, the receiving circuits 207 and 217 receive the analog input signal Ain and output the analog input signal AinO according to the analog input signal Ain. The subtraction signals (the subtraction voltages SN0 and SN1) between the analog input signal AinO in each of n successive conversions and the analog comparison signals (the first and second comparison voltages) obtained by DA-converting the control values DA0 and DA1 are calculated by a subtraction operation by the capacitors 206 and 207 provided in the comparison resistance-ladder type DA converter circuit 208 and a subtraction operation by the capacitors 216 and 217 provided in the comparison resistance-ladder type DA converter circuit 218. The comparators 204 and 214 determine whether the subtraction voltages SN0 and SN1 are higher than the reference voltage VC. Based on the comparison results DO0 and DO1 of the comparators 204 and 214, the control circuit 201 computes the digital output signal Vout corresponding to the analog input signal AinO. Furthermore, based on the comparison results DO0 and DO1 of the comparators 204 and 214, the control circuit 201 updates the control values DA0 and DA1 so that the analog comparison signals (the first and second comparison voltages) approach the analog input signal AinO. The DA converters 209 and 219 convert the control values DA0 and DA1 into the analog comparison signals (the first and second comparison voltages). Based on the comparison results DO0 and DO1 of the comparators 204 and 214, the output register 202 outputs the digital output signal.

Furthermore, the successive-approximation type AD converter 2 includes the first reference voltage terminal VC having the first reference voltage VC, the second reference voltage terminal VRP having the positive second reference voltage VRP by using the first reference voltage VC as a reference, and the third reference voltage terminal VRN having the negative third reference voltage VRN by using the first reference voltage VC as a reference. Moreover, the receiving circuits 207 and 217 have capacitors whose electrostatic capacity is Cin. Moreover, the DA converter 209 includes the resistance ladder 210 having the plurality of resistance elements connected in series between the second reference voltage terminal VRP and the third reference voltage terminal VRN, the capacitor 206 whose one end is connected to the storage node SN0, and the switch group 205 configured to connect the other end of the capacitor 206 to any of the plurality of resistance connection terminals formed at connections between resistance elements of the plurality of resistance elements of the resistance ladder 210 in accordance with the digital signal of the control value DA0. Moreover, the DA converter 219 includes the resistance ladder 220 having the plurality of resistance elements connected in series between the second reference voltage terminal VRP and the third reference voltage terminal VRN, the capacitor 216 whose one end is connected to the storage node SN1, and the switch group 215 configured to connect the other end of the capacitor 216 to any of the plurality of resistance connection terminals formed at connections between resistance elements of the plurality of resistance elements of the resistance ladder 220 in accordance with the digital signal of the control value DA1.

With this configuration, when the receiving circuits 207 and 217 receive the analog input signal Ain, the analog input signal AinO according to the received analog input signal Ain can be output to the storage nodes SN0 and SN1. This makes it possible to, by the control circuit 201, the comparators 204 and 214, and the output register 202, perform AD conversion processing such as a comparison process on the analog input signal AinO that changes in real time. As a result, compared to the configuration for the AD conversion processing of the sampled and held fixed analog input signal, delay due to sample hold can be removed and a conversion rate can be improved.

Fourth Embodiment

Next, the fourth embodiment of the present invention will be explained based on FIGS. 14 to 16.

Figure 14:
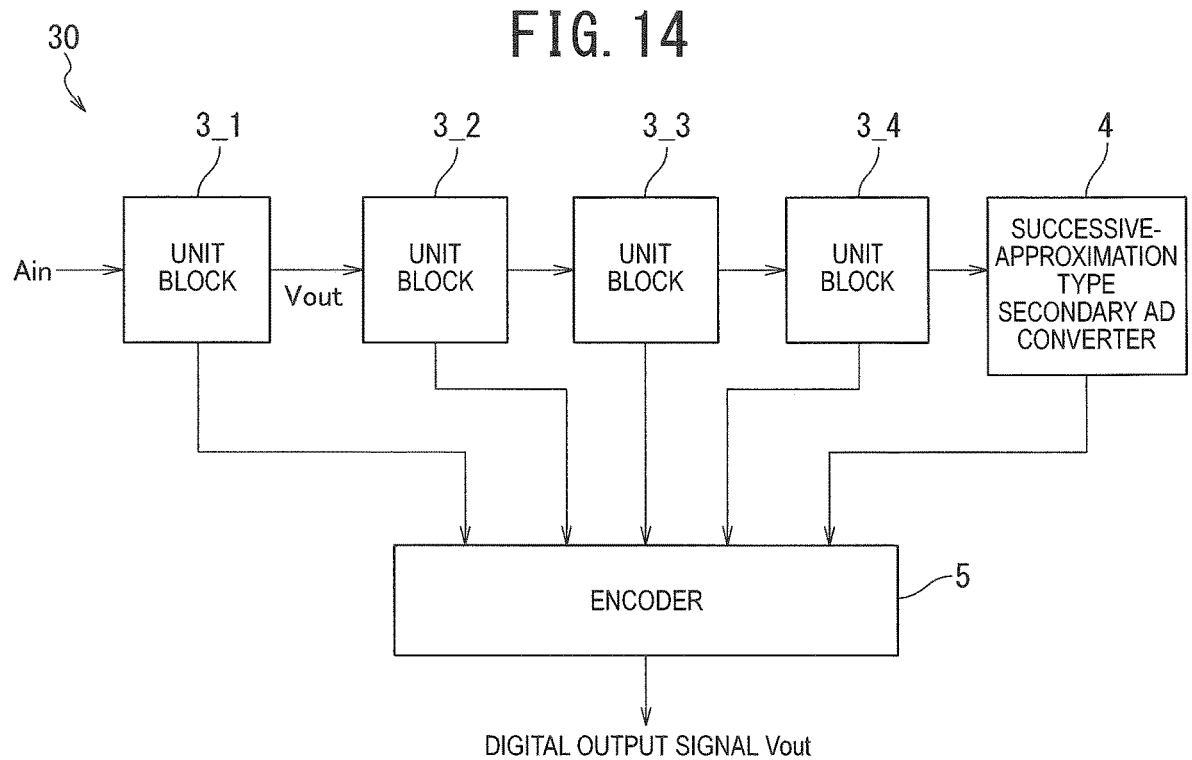
FIG. 14 is a block diagram illustrating a configuration example of a pipeline type AD converter according to the fourth embodiment.

FIG. 14 is a block diagram illustrating a configuration example of a pipeline type AD converter according to the fourth embodiment. FIG. 15 is a block diagram illustrating a specific configuration example of unit blocks according to the fourth embodiment. FIG. 16 is a timing chart at the time of a comparison operation of successive-approximation type secondary AD converters that constitute the first-stage and next-stage unit blocks of the pipeline type AD converter according to the fourth embodiment.

[Configuration]

The fourth embodiment has a configuration that the successive-approximation type AD converter 1 of the first embodiment is applied to the secondary AD converter of each unit block and the final-stage AD converter in the pipeline type AD converter. In other words, it can be said that the fourth embodiment has a configuration that the successive-approximation type AD converter 1 of the first embodiment is applied as SAR (successive-approximation type AD converter) constituting the pipeline type AD converter.

As illustrated in FIG. 14, a pipeline type AD converter 30 according to the fourth embodiment includes unit blocks 3_1, 3_2, 3_3, and 3_4 connected in cascade from the first stage to the fourth stage. Additionally, the pipeline type AD converter 30 includes a final-stage successive-approximation type secondary AD converter 4 cascaded to the unit block 3_4 and an encoder 5. Herein, the successive-approximation type secondary AD converter 4 has the same configuration as the successive-approximation type AD converter 1 of the first embodiment. Moreover, the unit blocks 3_1 to 3_4 correspond to a plurality of stages described in the claims and the successive-approximation type secondary AD converter 4 corresponds to a final stage described in the claims.

Because the unit blocks 3_1 to 3_4 have the same configuration, the unit blocks 3_1 to 3_4 are simply referred to as a "unit block 3" when there is no need to distinguish hereinafter.

Figure 15:
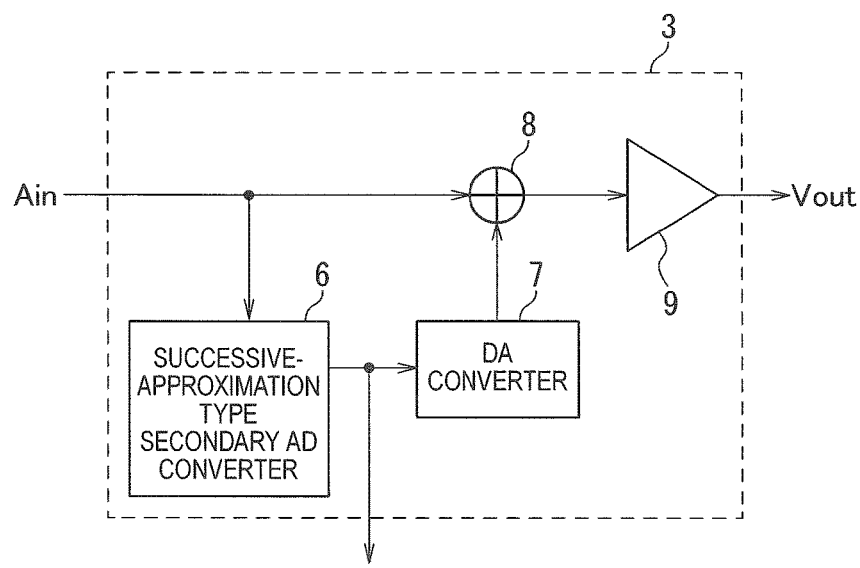
FIG. 15 is a block diagram illustrating a specific configuration example of a unit block according to the fourth embodiment.

As illustrated in FIG. 15, the unit block 3 includes a successive-approximation type secondary AD converter 6, a DA converter 7, a subtractor 8, and an amplifier 9.

The successive-approximation type secondary AD converter 6 has the same configuration as the successive-approximation type AD converter 1 of the first embodiment. The successive-approximation type secondary AD converter 6 AD-converts the analog input signal Ain or the analog signal (described later) input from the previous-stage unit block 3, and outputs the digital signal of the AD conversion result to the encoder 5 and the DA converter 7.

The DA converter 7 DA-converts the digital signal input from the successive-approximation type secondary AD converter 6 into an analog signal, and outputs the analog signal of the DA conversion result to the subtractor 8.

The subtractor 8 subtracts the analog signal input from the DA converter 7 from the analog input signal Ain input from the signal input terminal Ain, and outputs the analog signal of the subtraction result to the amplifier 9.

The amplifier 9 amplifies the analog signal input from the subtractor 8, and outputs the amplified signal to the next-stage unit block 3 or the final-stage successive-approximation type secondary AD converter 4.

Herein, the amplifier 9 corresponds to an amplifier circuit described in the claims.

The encoder 5 adds the digital signals input from the unit blocks 3_1 to 3_4 and the successive-approximation type secondary AD converter 4 to compute the final digital output signal Vout, and outputs the computed digital output signal Vout.

In addition, the successive-approximation type secondary AD converters 4 and 6 are not limited to the same configuration as the successive-approximation type AD converter 1 of the first embodiment. Therefore, the successive-approximation type secondary AD converters may have the same configuration as any one of the successive-approximation type AD converter 1A of the first embodiment, the successive-approximation type AD converter 1B of the second embodiment, and the successive-approximation type AD converter 2 of the third embodiment.

Figure 16:
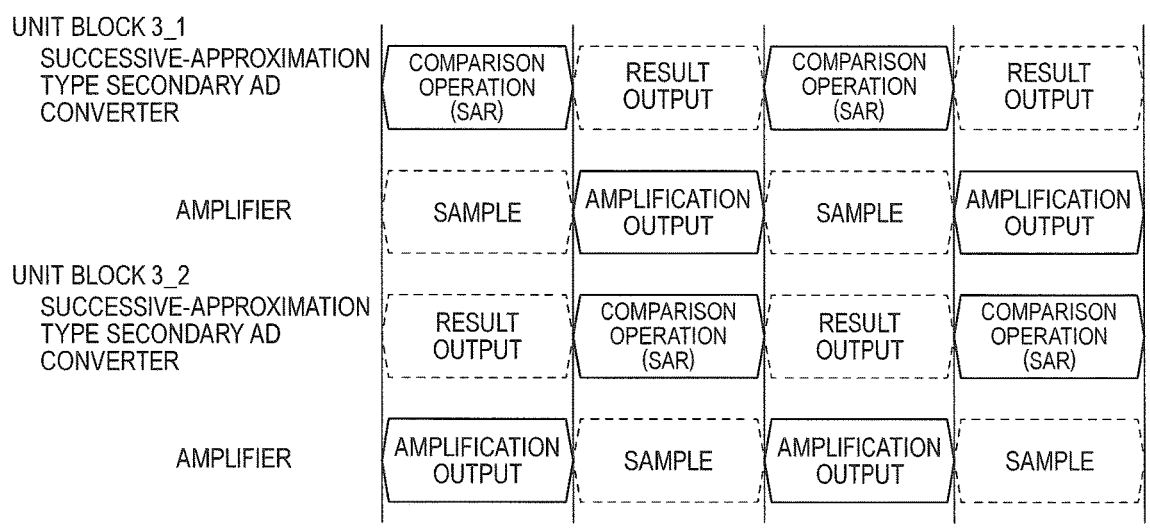
FIG. 16 is a timing chart at the time of a comparison operation of successive-approximation type secondary AD converters that constitute the first-stage and next-stage unit blocks of the pipeline type AD converter according to the fourth embodiment.

With such a configuration, the pipeline type AD converter 30 according to the fourth embodiment can perform comparison operations illustrated in FIG. 16.

In other words, the successive-approximation type secondary AD converters 6 constituting the unit blocks 3_1 and 3_2 perform the comparison operations while receiving the signals without sampling and holding the analog input signals. For that reason, as illustrated in FIG. 16, it is not necessary to sample a signal in a period corresponding to the "third time interval" of the pipeline type AD converter illustrated in FIG. 18 according to PTL 2. In other words, because there is not the "third time interval", conversion delay is shortened by that much and a high-speed operation is enabled.

[Actions and Effects of Fourth Embodiment]

The pipeline type AD converter 30 according to the fourth embodiment includes the cascaded unit blocks 3_1 to 3_4 and the final-stage successive-approximation type secondary AD converter 4. Each of the unit blocks 3_1 to 3_4 includes the successive-approximation type secondary AD converter 6 configured to convert the analog input signal into the digital output signal, the DA converter 7 configured to convert the digital output signal output from the successive-approximation type secondary AD converter 6 into the analog output signal, and the amplifier 9 configured to amplify the signal of the difference between the analog input signal and the analog output signal. Moreover, the final-stage successive-approximation type secondary AD converter 4 converts the analog signal output from the unit block 3_4 into the digital signal. Herein, the successive-approximation type secondary AD converters 4 and 6 are constituted by the successive-approximation type AD converter 1 of the first embodiment.

With this configuration, it is possible to realize the pipeline type AD converter that has low power consumption and suppresses the increase in a layout area while maintaining a conversion delay time equivalent to a case where a secondary AD converter is configured by a flash AD converter.

Modified Example

The second embodiment has the configuration that the comparison operations concurrently performed by two sets of the comparison switched capacitor circuit and the comparator in the first embodiment are perform by one set of the comparison switched capacitor circuit and the comparator in a time-division manner, but this embodiment is not limited to this configuration. For example, the same comparison operations as those of the successive-approximation type AD converter according to the related technology may be performed by one set of the comparison switched capacitor circuit and the comparator. Even with this configuration, similar to the first embodiment, the conversion delay due to the sample hold can be removed compared to the related art. In this regard, however, compared to the first embodiment, conversion errors when changing the analog input signal Ain cannot be reduced because comparison voltages do not have a partly overlapping range in the J-th and (J+1)th comparison operations. However, it is effective under an environment where the analog input signal Ain has small changes.

Moreover, the third embodiment has the configuration that similar to the first embodiment, the comparison operations are concurrently performed by two sets of the comparison resistance-ladder type DA converter circuit and the comparator, but this embodiment is not limited to this configuration. For example, similar to the second embodiment, the comparison operations may be performed by one set of the comparison resistance-ladder type DA converter circuit and the comparator in a time-division manner, or the same comparison operations as those of the successive-approximation type AD converter according to the related technology may be performed by one set of the comparison resistance-ladder type DA converter circuit and the comparator.

Moreover, in the first and second embodiments, the comparison voltage is generated by using the comparison switched capacitor circuit, but it is not limited to this configuration. It may be configured by a DA converter circuit where a switched capacitor circuit and a resistance ladder circuit are combined by connecting the output of a resistance-ladder type DA converter circuit as used in the third embodiment to the VRP and VRN terminals of the comparison switched capacitor circuit, for example.

Each of the successive-approximation type AD converter circuits according to the first and third embodiments includes two receiving circuits, two comparators, two DA converter circuits, and two subtractors, but the present invention is not limited to the above. The successive-approximation type AD converter circuit may include three or more receiving circuits, three or more comparators, three or more DA converter circuits, and three or more subtractors. In this case, because three or more comparison voltages are set, AD conversion can be performed with higher accuracy.

DESCRIPTION OF REFERENCE NUMERALS 1, 1A, 1B, 2 successive-approximation type AD converter,
3_1 to 3_4 unit block,
4, 6 successive-approximation type secondary AD converter,
5 encoder,
7, 109, 109A, 119, 119A, 209, 219 DA converter,
8, 108a, 108b, 118a, 118b subtractor,
9 amplifier,
30 pipeline type AD converter,
101, 201 control circuit,
102, 202 output register,
104, 114, 204, 214 comparator,
103a to 103c, 103d_1 to 103d_(n+1), 103e_1 to 103e_(n+1), 103f_1 to 103f_(n+1), 113a to 113c, 113d_1 to 113d_(n+1), 113e_1 to 113e_(n+1), 113f_1 to 113f_(n+1), 203a to 203c switch,
105_1 to 105_(n+1), 115_1 to 115_(n+1), 205, 215 switch group,
107, 107A, 117, 117A, 207, 217 receiving circuit,
108, 118 comparison switched capacitor circuit,
208, 218 comparison resistance-ladder type DA converter circuit,
SN0, SN1 storage node,
VC first reference voltage terminal,
VRP second reference voltage terminal,
VRN third reference voltage terminal.

What is claimed is:

1. A successive-approximation type AD converter comprising:
a receiving circuit configured to receive a first analog input signal and to continuously output a second analog input signal according to the first analog input signal;
a subtraction signal calculation circuit configured to calculate a subtraction signal between an analog reference signal and the second analog input signal in each of n successive conversions (n is a natural number of 2 or more, the same applies hereinafter);
a determining circuit configured to determine whether a voltage of the subtraction signal is higher than a reference voltage;
a reference value arithmetic circuit configured to update a reference value so that the analog reference signal approaches the second analog input signal based on a determination result of the determining circuit;
a DA converter configured to convert the reference value into the analog reference signal; and
an output circuit configured to output a digital output signal based on the determination result of the determining circuit.

2. The successive-approximation type AD converter according to claim 1, comprising:
first to m-th (m is a natural number of 2 or more, the same applies hereinafter) of the receiving circuits;
first to m-th of the determining circuits;
first to m-th of the DA converters; and
first to m-th of the subtraction signal calculation circuits, wherein
the reference value arithmetic circuit updates the reference value respectively corresponding to the first to m-th DA converters based on determination results of the first to m-th determining circuits at a timing of the successive conversion, and
the output circuit computes the digital output signal based on the determination results of the first to m-th determining circuits.

3. The successive-approximation type AD converter according to claim 2, wherein
the reference value arithmetic circuit:
sets a voltage range having a plurality of determination sections when the second analog input signal is determined based on the determination results of the first to m-th determining circuits; and
updates the reference value respectively corresponding to the first to m-th DA converters so that the voltage range at a (j+1)th determination set based on a determination result in a first determination section among the plurality of determination sections at a j-th time (j is a natural number of 1≤j≤(n−1), the same applies hereinafter) of the determining circuit overlaps with a voltage range at a (j+1)th determination set based on a determination result in a second determination section adjacent to the first determination section by at least part of the range.

4. The successive-approximation type AD converter according to claim 3, wherein the reference value arithmetic circuit updates the reference value respectively corresponding to the first to m-th DA converters so that a width of the voltage range at the (j+1)th determination is a half of a width of the voltage range at the j-th determination.

5. The successive-approximation type AD converter according to claim 1, wherein
the receiving circuit has:
a first switch circuit into which the first analog input signal is input; and
a first capacitive element connected between the first switch circuit and the subtraction signal calculation circuit.

6. The successive-approximation type AD converter according to claim 5, comprising:
a first reference voltage terminal having a first reference voltage;
a second reference voltage terminal having a positive second reference voltage by using the first reference voltage as a reference; and a third reference voltage terminal having a negative third reference voltage by using the first reference voltage as a reference, wherein the DA converter has:

second to L-th (L is a natural number of three or more, the same applies hereinafter) capacitive elements whose one ends are connected to the subtraction signal calculation circuit; and a second switch circuit configured to connect each of other ends of the second to L-th capacitive elements to any one of the first reference voltage terminal, the second reference voltage terminal, and the third reference voltage terminal in accordance with the reference value.

7. The successive-approximation type AD converter according to claim 6, wherein a capacitance value of a K-th capacitive element (K is a natural number of 2≤K≤L) among the first to L-th capacitive elements is a value obtained by multiplying a capacitance value of the L-th capacitive element by the (L−K) power 2.

8. The successive-approximation type AD converter according to claim 1, comprising:

a first reference voltage terminal having a first reference voltage;

a second reference voltage terminal having a positive second reference voltage by using the first reference voltage as a reference; and a third reference voltage terminal having a negative third reference voltage by using the first reference voltage as a reference, wherein the DA converter includes:

a plurality of resistance elements connected in series between the second reference voltage terminal and the third reference voltage terminal;

a second capacitive element whose one end is connected to the subtraction signal calculation circuit; and a second switch circuit configured to connect another end of the second capacitive element to any of a plurality of terminals formed at connections between resistance elements among the plurality of resistance elements in accordance with the reference value.

9. A pipeline type AD converter having a plurality of stages and a final stage cascaded, each of the plurality of stages comprising:

a first successive-approximation type secondary AD converter configured to convert an analog input signal into a digital output signal;

a DA converter configured to convert the digital output signal output from the first successive-approximation type secondary AD converter into an analog output signal; and an amplifier circuit configured to amplify a signal of a difference between the analog input signal and the analog output signal, the final stage has:

a second successive-approximation type secondary AD converter configured to convert the signal of the difference output from a last-end stage of the plurality of stages into a digital output signal, and the first and second successive-approximation type secondary AD converters being constituted by the successive-approximation type AD converter according to claim 1.

10. A pipeline type AD converter having a plurality of stages and a final stage cascaded, each of the plurality of stages comprising:

a first successive-approximation type secondary AD converter configured to convert an analog input signal into a digital output signal;

a DA converter configured to convert the digital output signal output from the first successive-approximation type secondary AD converter into an analog output signal; and an amplifier circuit configured to amplify a signal of a difference between the analog input signal and the analog output signal, the final stage has:

a second successive-approximation type secondary AD converter configured to convert the signal of the difference output from a last-end stage of the plurality of stages into a digital output signal, and the first and second successive-approximation type secondary AD converters being constituted by the successive-approximation type AD converter according to claim 2.

11. A pipeline type AD converter having a plurality of stages and a final stage cascaded, each of the plurality of stages comprising:

a first successive-approximation type secondary AD converter configured to convert an analog input signal into a digital output signal;

a DA converter configured to convert the digital output signal output from the first successive-approximation type secondary AD converter into an analog output signal; and an amplifier circuit configured to amplify a signal of a difference between the analog input signal and the analog output signal, the final stage has:

a second successive-approximation type secondary AD converter configured to convert the signal of the difference output from a last-end stage of the plurality of stages into a digital output signal, and the first and second successive-approximation type secondary AD converters being constituted by the successive-approximation type AD converter according to claim 3.

12. A pipeline type AD converter having a plurality of stages and a final stage cascaded, each of the plurality of stages comprising:

a first successive-approximation type secondary AD converter configured to convert an analog input signal into a digital output signal;

a DA converter configured to convert the digital output signal output from the first successive-approximation type secondary AD converter into an analog output signal; and an amplifier circuit configured to amplify a signal of a difference between the analog input signal and the analog output signal, the final stage has:

a second successive-approximation type secondary AD converter configured to convert the signal of the difference output from a last-end stage of the plurality of stages into a digital output signal, and the first and second successive-approximation type secondary AD converters being constituted by the successive-approximation type AD converter according to claim 4.

13. A pipeline type AD converter having a plurality of stages and a final stage cascaded, each of the plurality of stages comprising:
- a first successive-approximation type secondary AD converter configured to convert an analog input signal into a digital output signal;
- a DA converter configured to convert the digital output signal output from the first successive-approximation type secondary AD converter into an analog output signal; and
- an amplifier circuit configured to amplify a signal of a difference between the analog input signal and the analog output signal, the final stage has:
- a second successive-approximation type secondary AD converter configured to convert the signal of the difference output from a last-end stage of the plurality of stages into a digital output signal, and
- the first and second successive-approximation type secondary AD converters being constituted by the successive-approximation type AD converter according to claim 5.

14. A pipeline type AD converter having a plurality of stages and a final stage cascaded, each of the plurality of stages comprising:
- a first successive-approximation type secondary AD converter configured to convert an analog input signal into a digital output signal;
- a DA converter configured to convert the digital output signal output from the first successive-approximation type secondary AD converter into an analog output signal; and
- an amplifier circuit configured to amplify a signal of a difference between the analog input signal and the analog output signal, the final stage has:
- a second successive-approximation type secondary AD converter configured to convert the signal of the difference output from a last-end stage of the plurality of stages into a digital output signal, and
- the first and second successive-approximation type secondary AD converters being constituted by the successive-approximation type AD converter according to claim 6.

15. A pipeline type AD converter having a plurality of stages and a final stage cascaded, each of the plurality of stages comprising:
- a first successive-approximation type secondary AD converter configured to convert an analog input signal into a digital output signal;
- a DA converter configured to convert the digital output signal output from the first successive-approximation type secondary AD converter into an analog output signal; and
- an amplifier circuit configured to amplify a signal of a difference between the analog input signal and the analog output signal, the final stage has:
- a second successive-approximation type secondary AD converter configured to convert the signal of the difference output from a last-end stage of the plurality of stages into a digital output signal, and
- the first and second successive-approximation type secondary AD converters being constituted by the successive-approximation type AD converter according to claim 7.

16. A pipeline type AD converter having a plurality of stages and a final stage cascaded, each of the plurality of stages comprising:
- a first successive-approximation type secondary AD converter configured to convert an analog input signal into a digital output signal;
- a DA converter configured to convert the digital output signal output from the first successive-approximation type secondary AD converter into an analog output signal; and
- an amplifier circuit configured to amplify a signal of a difference between the analog input signal and the analog output signal, the final stage has:
- a second successive-approximation type secondary AD converter configured to convert the signal of the difference output from a last-end stage of the plurality of stages into a digital output signal, and
- the first and second successive-approximation type secondary AD converters being constituted by the successive-approximation type AD converter according to claim 8.

* * * * *